(12) United States Patent
Yamamoto et al.

(10) Patent No.: US 7,034,434 B2
(45) Date of Patent: Apr. 25, 2006

(54) SURFACE ACOUSTIC WAVE DEVICE

(75) Inventors: Koji Yamamoto, Ishikawa-ken (JP); Masashi Omura, Shiga-ken (JP); Katsuhiro Ikada, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 36 days.

(21) Appl. No.: 10/492,134

(22) PCT Filed: May 28, 2003

(86) PCT No.: PCT/JP03/06634

§ 371 (c)(1),
(2), (4) Date: Apr. 7, 2004

(87) PCT Pub. No.: WO03/103142

PCT Pub. Date: Dec. 11, 2003

(65) Prior Publication Data
US 2004/0251777 A1 Dec. 16, 2004

(30) Foreign Application Priority Data
Jun. 3, 2002 (JP) .............................. 2002-160950
Apr. 23, 2003 (JP) .............................. 2003-119119

(51) Int. Cl.
*H01L 41/053* (2006.01)

(52) U.S. Cl. .................. 310/313 R; 310/344; 310/348; 310/349

(58) Field of Classification Search ................ 310/340, 310/344, 348–349, 313 R
See application file for complete search history.

(56) References Cited

U.S. PATENT DOCUMENTS

| 5,969,461 | A | * | 10/1999 | Anderson et al. | ....... 310/313 R |
| 6,329,739 | B1 | * | 12/2001 | Sawano | .................. 310/313 R |
| 2004/0085001 | A1 | * | 5/2004 | Takeshima | .................. 310/331 |

FOREIGN PATENT DOCUMENTS

| JP | 6-204291 | 7/1994 |
| JP | 08-316778 | 11/1996 |
| JP | 10-098134 | 4/1998 |
| JP | 10-321666 | 12/1998 |
| JP | 11-055066 | 2/1999 |
| JP | 2000-124767 | 4/2000 |

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

A surface acoustic wave device includes a sealing resin for sealing a gap between a surface acoustic wave element and a mounting board. The sealing resin is prevented from flowing so as to reach a vibrating portion of the surface acoustic wave element. In the surface acoustic wave device, a surface acoustic wave element is connected to a mounting board through bumps, the outer peripheral edge of the surface acoustic wave element is sealed by a sealing resin, and a vibration space is secured between the vibrating portion of the surface acoustic wave element and mounting board. In the surface acoustic wave element, an outer barrier enclosing the bumps and the vibrating portion and an inner barrier enclosing the vibrating portion are provided, the height of the outer barrier is lower than the total height of the height of the bumps and the height of electrode lands formed on the mounting board, and the height of the inner barrier is lower than the height of the bumps.

21 Claims, 18 Drawing Sheets

SURFACE ACOUSTIC WAVE DEVICE

BACKGROUND OF THE INVENTION

1. Field of the Invention

The present invention relates to a surface acoustic wave device and more particularly, to a surface acoustic wave device in which a sealing resin for sealing a gap between a surface acoustic wave element and a mounting board is prevented from flowing so as to reach a vibrating portion of the surface acoustic wave element.

2. Description of Related Art

One example of a known surface acoustic wave device is disclosed in Patent Document 1 (Japanese Unexamined Patent Application Publication No. 8-316778) and its structure is shown in FIG. 21. In this the surface acoustic wave device 51, a surface acoustic wave element (SAW device chip) 52 and a mounting board 53 are integrated and the functional surface of the surface acoustic wave element 52 is connected to the mounting board 53 through bumps 54.

On the functional surface of the surface acoustic wave element 52, as shown in FIG. 22, a vibrating portion 56 including a comb-shaped electrode portion (hereinafter called an IDT), etc., is provided, a vibration space 57 is secured between the vibrating portion 56 and the mounting board 53, and the outer peripheral edge of the surface acoustic wave element 52 is sealed by using a sealing resin 58 composed of a thermosetting resin such as an epoxy resin, etc. Moreover, on the mounting surface of the mounting board 53, as shown in FIG. 23, electrode lands 59 for connecting the bumps 54 at fixed locations are formed.

Furthermore, in the surface acoustic wave device 51, in order to prevent the sealing resin 58 for sealing a gap between the surface acoustic wave element 52 and the mounting board 53 from flowing to the vibrating portion 56 of the surface acoustic wave element 52, two inner and outer barriers 61 and 62 that block the resin flow, which are made lower than the bumps 54 and disposed so as to enclose the vibrating portion 56, are provided on the functional surface of the surface acoustic wave element 52. That is, the barriers 61 and 62 are formed by using a photoresist and function as a barrier for preventing the sealing resin 56 from flowing in. The reason why these barriers 61 and 62 are set lower than the bumps 51 is that, when the surface acoustic wave element 52 is flip-chip bonded to the mounting board 53, even if the bumps 54 are pressed, the bumps 54 have a sufficient connecting strength and a small gap is secured between the barriers 61 and 62 and the mounting board 53.

In the surface acoustic wave device 51 constructed in this way, the sealing resin 58 coated for sealing the outer peripheral edge of the surface acoustic wave element 52 reaches a gap between the outer barrier 61 and the mounting board 53 due to the surface tension and, according to circumstances, reaches a gap between the inner barrier 62 and the mounting board 53. However, since the gap is narrow, the sealing resin 58 does not flow in over the barriers 61 and 62 and, as a result, the sealing resin 58 is prevented from flowing in so as to reach the vibrating portion 56 of the surface acoustic wave element 52.

However, in the related surface acoustic wave device 51 described above, the relative location of the barriers 61 and 62 and the bumps 54 is not considered and the two barriers 61 and 62 are provided only to enclose the vibrating portion 56. Then, each of the barriers 61 and 62 faces the electrode lands 59 or faces the mounting surface of the mounting board 53 which is exposed, without having the electrode lands 59 formed therebetween. In such a case, the spacing between the barriers 61 and 62 and the mounting surface of the mounting board 53 becomes irregular.

As a result, although the inner and outer barriers 61 and 62 are provided on the functional surface of the surface acoustic wave element 52, the sealing resin 58 cannot be prevented from flowing in over the barriers 61 and 62, and the sealing resin 58 reaches the vibrating portion 56 of the surface acoustic wave element 52 and may attach to the vibrating portion 56. When this occurs, degradation of the performance of the surface acoustic wave device 51 is unavoidable and the rate of defective surface acoustic wave devices 51 increases.

SUMMARY OF THE INVENTION

In order to overcome the problems described above, preferred embodiments of the present invention provide a surface acoustic wave device in which a sealing resin for sealing a gap between a surface acoustic wave element and a mounting board can be surely prevented from flowing in to reach a vibrating portion of the surface acoustic wave element.

A surface acoustic wave device according to a first preferred embodiment of the present invention includes a surface acoustic wave element having, on a functional surface thereof, a vibrating portion including at least one comb-shaped electrode portion disposed on a piezoelectric substrate, a mounting board, and a sealing resin. In the surface acoustic wave device, the surface acoustic wave element and the mounting board are connected through bumps so that the mounting surface of the mounting board and the functional surface of the surface acoustic wave element face each other, the outer peripheral edge of the surface acoustic wave element is sealed by the sealing resin, and a vibration space is secured between the vibrating portion of the surface acoustic wave element and the mounting surface of the mounting board. Also, an outer barrier disposed so as to enclose the bumps and the vibrating portion is provided on the functional surface of the surface acoustic wave element and the outer barrier includes a level difference.

In the surface acoustic wave device according to a first preferred embodiment of the present invention, since the outer barrier includes a level difference, the sealing resin can be prevented from flowing in at the outer barrier, and accordingly, the occurrence of defect, which is caused when the sealing resin flows to the vibrating portion of the surface acoustic wave element, can be prevented.

A surface acoustic wave device according to a second preferred embodiment of the present invention includes a surface acoustic wave element having, on a functional surface thereof, a vibrating portion including at least one comb-shaped electrode portion disposed on a piezoelectric substrate, a mounting board, and a sealing resin. In the surface acoustic wave device, the surface acoustic wave element and the mounting board are connected through bumps so that the mounting surface of the mounting board and the functional surface of the surface acoustic wave element face each other, the outer peripheral edge of the surface acoustic wave element is sealed by the sealing resin, and a vibration space is secured between the vibrating portion of the surface acoustic wave element and the mounting surface of the mounting board. Also an outer barrier disposed so as to enclose the bumps and the vibrating portion and an inner barrier disposed inside the bumps so as to enclose the vibrating portion are provided on the functional surface of the surface acoustic wave element.

In the surface acoustic wave device according to a second preferred embodiment of the present invention, since the outer barrier and the inner barrier are provided, even if the flow of the sealing resin cannot be blocked at the outer barrier, the sealing resin can be prevented from flowing in at the inner barrier, and accordingly, the occurrence of defects, which are caused when the sealing resin flows to the vibrating portion of the surface acoustic wave element, can be prevented.

It is desirable that the outer barrier is higher than the inner barrier. In particular, it is desirable that the height of the outer barrier is lower than the total height of the bumps after the surface acoustic wave element and the mounting board have been connected through the bumps and the electrode lands formed on the mounting surface of the mounting board, and the height of the inner barrier is preferably lower than the height of the bumps after the surface acoustic wave element and the mounting board have been connected through the bumps.

It is also desirable that at least the inner barrier is formed by using a material that is inferior in wettability against the sealing resin to the functional surface of the surface acoustic wave element and the mounting surface of the mounting board. Furthermore, it is desirable that the inner barrier includes a first inner barrier and a second inner barrier. In particular, it is desirable that the first inner barrier and the second inner barrier have nearly the same height. At this time, it is desirable that the first inner barrier and the second inner barrier are formed by using the same material.

Furthermore, it is desirable that the outer barrier has a level difference. Moreover, in the surface acoustic wave device according to a first or second preferred embodiment of the present invention, it is desirable that the level difference in the outer barrier is formed by at least one concave portion or by at least one convex portion.

A surface acoustic wave device according to a third preferred embodiment of the present invention includes a surface acoustic wave element on the functional surface of which a vibrating portion including at least one comb-shaped electrode portion disposed on a piezoelectric substrate, a mounting board, and a sealing resin. In the surface acoustic wave device, the surface acoustic wave element and the mounting board are connected through bumps so that the mounting surface of the mounting board and the functional surface of the surface acoustic wave element face each other, the outer peripheral edge of the surface acoustic wave element is sealed by the sealing resin, and a vibration space is secured between the vibrating portion of the surface acoustic wave element and the mounting surface of the mounting board. Also a first outer barrier disposed so as to enclose the bumps and the vibrating portion and a second outer barrier disposed inside the first outer barrier so as to enclose the bumps and the vibrating portion are provided on the functional surface of the surface acoustic wave element.

In the surface acoustic wave device according to a third preferred embodiment of the present invention, since the first outer barrier and the second outer barrier are provided, even if the flow of the sealing resin cannot be blocked at the first outer barrier, the sealing resin can be prevented from flowing in at the second outer barrier, and accordingly, the occurrence of defects, which are caused when the sealing resin flows to the vibrating portion of the surface acoustic wave element, can be prevented.

It is desirable that the first outer barrier is higher than the second outer barrier. In particular, it is desirable that the height of the first outer barrier is lower than the total height of the bumps after the surface acoustic wave element and the mounting board have been connected through the bumps and the electrode lands provided on the mounting surface of the mounting board, and the height of the second outer barrier is preferably higher than the height of the bumps after the surface acoustic wave element and the mounting board have been connected through the bumps.

Also, it is desirable that the first outer barrier is made of at least two layers, and the lowest layer of the first outer barrier has the same height as the second outer barrier. Furthermore, it is desirable that at least the second outer barrier is formed by using a material that is inferior in wettability against the sealing resin to the functional surface of the surface acoustic wave element and the mounting surface of the mounting board. In this case, it is desirable that the first outer barrier includes a level difference, and it is desirable that the level difference in the first outer barrier is formed by at least one concave portion or by at least one convex portion.

Alternatively, in the surface acoustic wave device according to a first, second, and third preferred embodiments of the present invention, it is desirable that a board-side barrier is arranged on the mounting board so as to face the outer barrier. In particular, it is desirable that the total height of the outer barrier and the board-side barrier is lower than the total height of the bumps after the surface acoustic wave element and the mounting board have been connected through the bumps and the electrode lands formed on the mounting surface of the mounting board.

Other features, elements, characteristics and advantages of the present invention will be apparent from the detailed description of preferred embodiments thereof with reference to the attached drawings.

DETAILED DESCRIPTION OF PREFERRED EMBODIMENTS

First Preferred Embodiment

Figure 1:
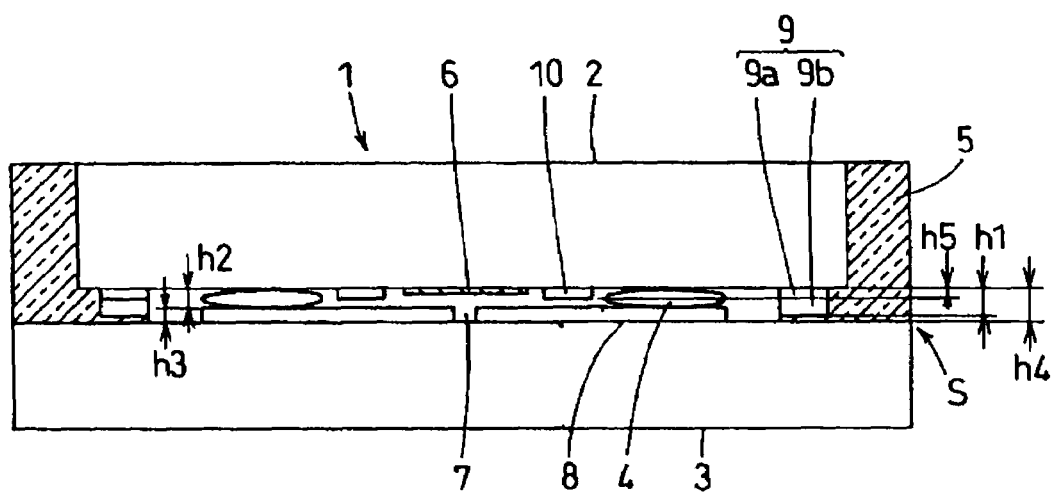
FIG. 1 is a transverse sectional view showing the structure of a surface acoustic wave device according to a first preferred embodiment of the present invention.
Figure 2:
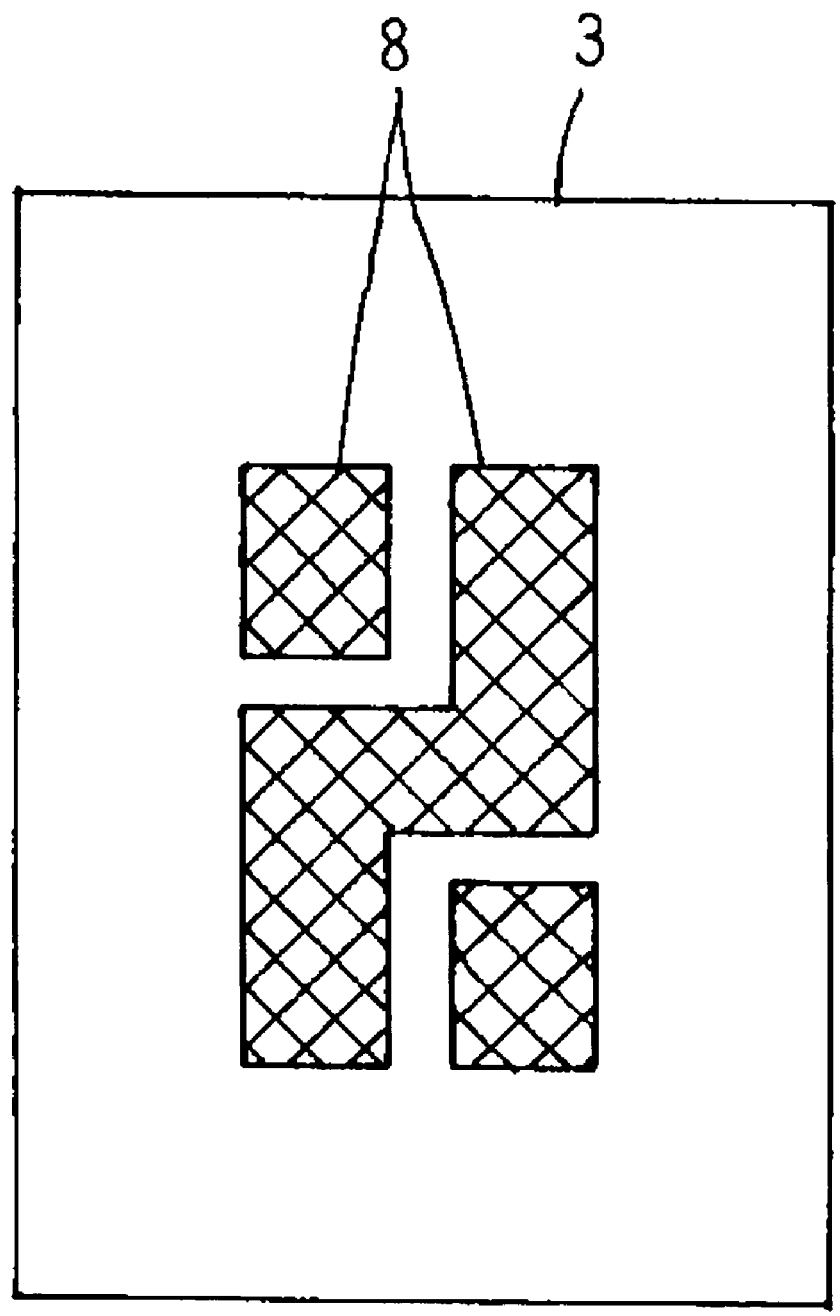
FIG. 2 is a top view showing the structure of a mounting board according to the first preferred embodiment of the present invention.
Figure 3:
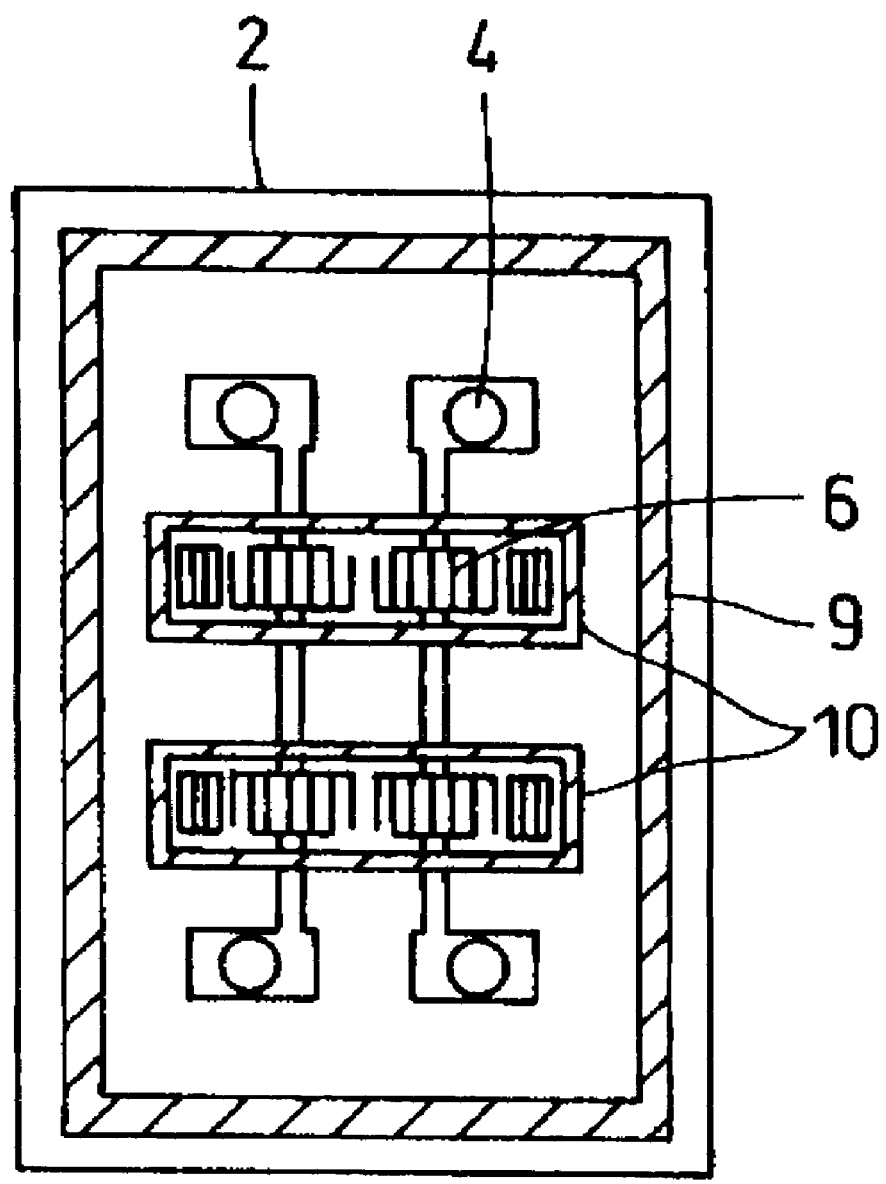
FIG. 3 is a top view showing the structure of a surface acoustic wave element according to the first preferred embodiment of the present invention.
Figure 4:
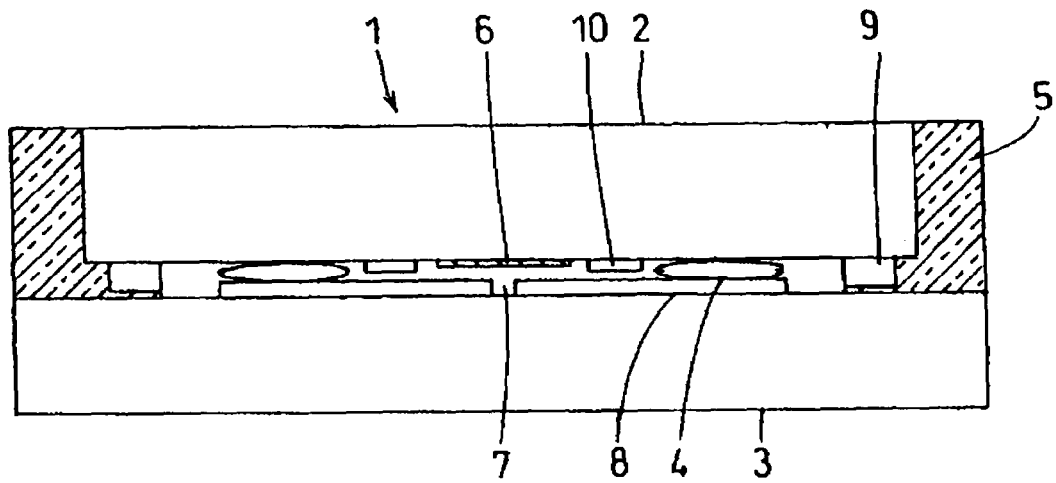
FIG. 4 is a transverse sectional view showing the structure of a surface acoustic wave device according to a first modified example of the first preferred embodiment of the present invention.
Figure 5:
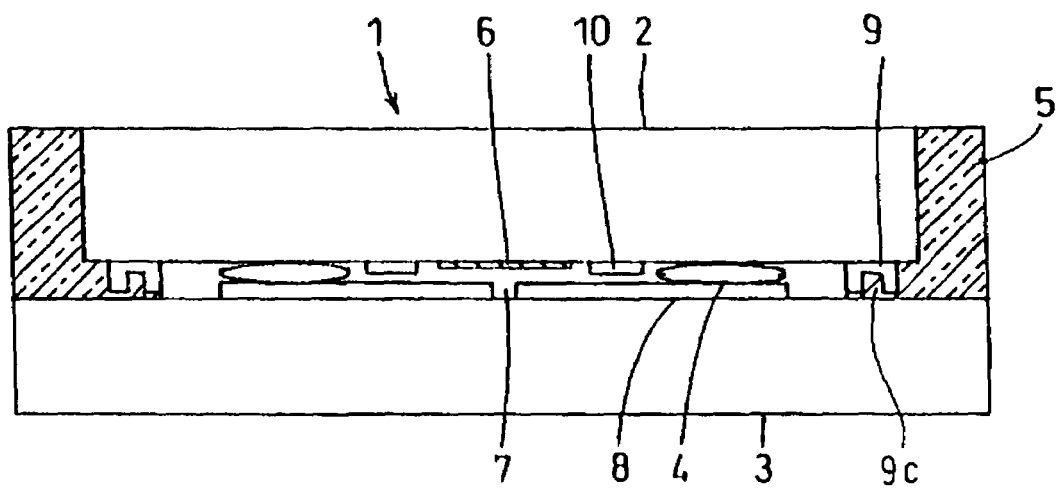
FIG. 5 is a transverse sectional view showing the structure of a surface acoustic wave device according to a second modified example of the first preferred embodiment of the present invention.
Figure 6:
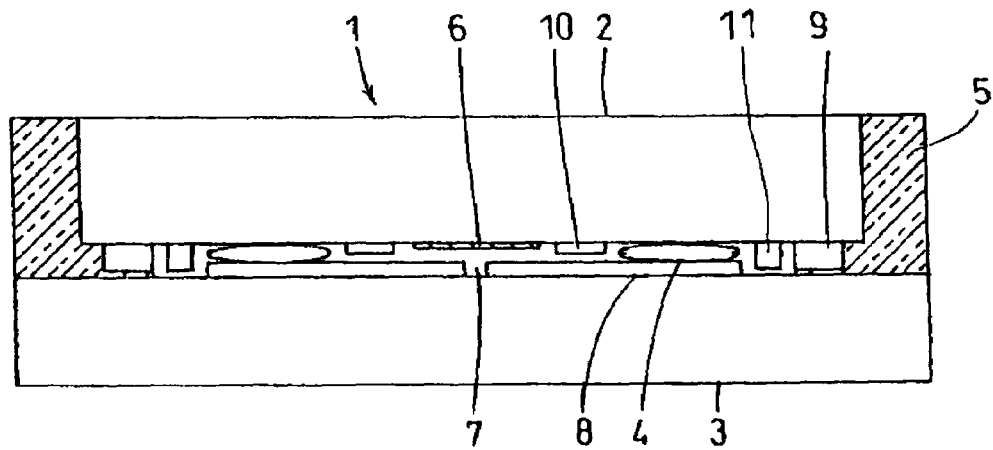
FIG. 6 is a transverse sectional view showing the structure of a surface acoustic wave device according to a third modified example of the first preferred embodiment of the present invention.
Figure 7:
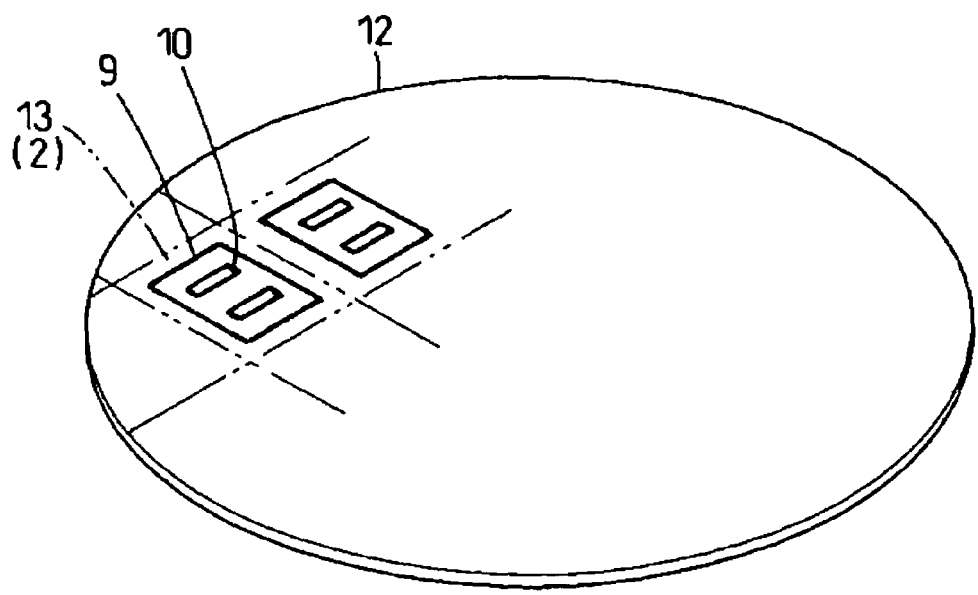
FIG. 7 shows the manufacturing process of the surface acoustic wave element according to the first preferred embodiment of the present invention.
Figure 8:
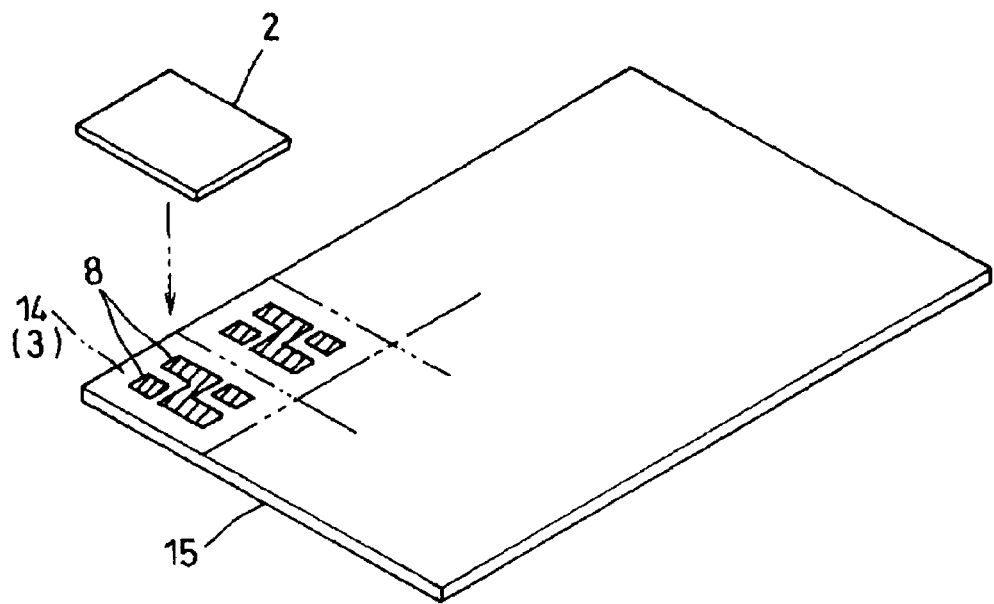
FIG. 8 shows the manufacturing process of the surface acoustic wave device according to the first preferred embodiment of the present invention.

FIG. 1 is a transverse sectional view showing the structure of a surface acoustic wave device according to the first preferred embodiment, FIG. 2 is a top view showing the structure of a mounting board according to first preferred embodiment, and FIG. 3 is a top view showing the structure of a surface acoustic wave element according to the first preferred embodiment. FIG. 4 is a transverse sectional view showing the structure of a surface acoustic wave device according to a first modified example, FIG. 5 is a transverse sectional view according to a second modified example, and FIG. 6 is a transverse sectional view according to a third modified example. FIG. 7 shows the manufacturing process of the surface acoustic wave element according to first preferred embodiment, and FIG. 8 shows the manufacturing process of a surface acoustic wave device.

In a surface acoustic wave device 1 according to the first preferred embodiment, as shown in FIG. 1, the functional surface of a surface acoustic wave element (SAW device chip) 2 and the mounting surface of a mounting substrate 3 are arranged so as to face each other and are connected to each other through bumps 4 made of gold, and the outer peripheral edge of the surface acoustic wave element 2 is sealed by a sealing resin 5 which includes a thermosetting resin such as epoxy resin, etc. Then, a vibration space 7, which is required to generate a surface acoustic wave, is secured between the functional surface of the surface acoustic wave element 2, that is, a vibrating portion 6 of the surface acoustic wave element 2 including an IDT, reflector, and wiring portion provided on a piezoelectric substrate, and the mounting surface of the mounting board 3 made of a dielectric material such as alumina, etc. Moreover, on the mounting surface of the mounting board 3, as shown in FIG. 2, electrode lands 8 are provided at fixed locations so that the bumps 4 may be connected at fixed locations. The IDT, reflector, and wiring portion of the surface acoustic wave element 2 in FIG. 3 are omitted. The electrode lands 8 may have a different shape from that in FIG. 2.

On the other hand, on the functional surface of the surface acoustic wave element 2, an outer barrier 9 that blocks the resin flow and an inner barrier 10 that blocks the resin flow are provided so that the sealing resin 5 for sealing a gap between the surface acoustic wave element 2 and the mounting board 3 may be prevented from flowing to the vibrating portion 6 of the surface acoustic wave element 2. That is, as shown in FIG. 3, on the functional surface of the surface acoustic wave element 2, the outer barrier 9, which is disposed at an outer location of the piezoelectric substrate to enclose both the bumps 4 and the vibration portion 6 and has a substantially rectangular shape when viewed from the top, and the inner barrier 10, which is at an inner location to enclose only the vibrating portion 6 and has a substantially rectangular shape when viewed from the top, are provided. Moreover, the corner portions of the outer barrier 9 and the inner barrier 10 may be made substantially round.

The outer barrier 9 and the inner barrier 10 are preferably formed by a photoresist method using a material that is inferior in wettability against the sealing resin 5 compared to the functional surface of the surface acoustic wave element 2 and the mounting surface of the mounting board 3, for example, a photosensitive polyimide resin, BCB (resin component: benzocyclobutene), Zcoat (resin component: cyclic polyolefin), etc. Here, the outer barrier 9 has a double-layer structure in which a lower layer 9a and an upper layer 9b are laminated.

Although it is desirable that the material used in the outer barrier 9 and the inner barrier 10 be excellent in heat resistance during reflow when the surface acoustic wave device 1 is mounted on a printed circuit board by using solder, the reflow temperature is dependent on the solder material. For example, the reflow temperature of a eutectic solder material of Sn—Pb is 180° C. and the reflow temperature of a solder material of Sn—Ag—Cu is 220° C. When these are taken into consideration, it is sufficient for the material used in the outer barrier 9 and the inner barrier 10 to withstand a temperature of about 260° C.

That is, the material for forming the outer barrier 9 and the inner barrier 10 preferably has the following characteristics. First, regarding the heat resistance to the reflow when mounting by soldering, it is required that no remarkable deformation, decomposition, and outgassing be caused. However, after sealing by the sealing resin 5, the condition that no deformation be caused is not necessarily required.

Next, in order to prevent the inflow of the sealing resin 5, it is desirable that the material for forming the barriers 9 and 10 be inferior in wettability against the sealing resin 5 to the surface of the piezoelectric substrate of the surface acoustic wave element 2 and the mounting board 3 and to the surface of the electrode lands 8, etc., disposed on the mounting board 3. Furthermore, the material for forming the barriers 9 and 10 is required to have a low dielectric constant. If the material has a large dielectric constant, the electrical properties, the input capacitance in particular, are changed by the disposition of the inner and outer barriers 9 and 10 and, as a result, the characteristics of the surface acoustic wave device 1 may be deteriorated. Accordingly, it is desirable that the inner and outer barriers 9 and 10 have a dielectric constant lower than that of the piezoelectric substrate of the surface acoustic wave element 2. Moreover, after the barriers 9 and 10 have been formed, they are required to have a hardness which does not allow their deformation. Furthermore, in order to eliminate the deformation of a surface acoustic wave caused by the difference in linear expansion coefficient between the surface acoustic wave element 2 and the mounting board 3, a lower hardness is desired.

On the other hand, in order to cope with changes in temperature, the material for forming the barriers 9 and 10 preferably has nearly the same linear expansion coefficient as that of the piezoelectric substrate of the surface acoustic wave element 2. For example, when the substrate is made of $LiTaO_3$, since the linear expansion coefficient is about 15 ppm/°C. in the propagation direction of a surface acoustic wave and about 7 ppm/°C. in the direction perpendicular to the propagation direction of the surface acoustic wave, it is desirable that the linear expansion coefficients of the material for forming the barriers 9 and 10 be close to these coefficients. Moreover, in order to prevent the inner barrier 10 from coming into contact with the vibrating portion 6, it is desirable that the linear expansion coefficient of the inner barrier 10 be lower than that of the bumps 4.

Furthermore, the barriers 9 and 10 are preferably made of a material which makes it possible for the height of the barriers 9 and 10 from the piezoelectric substrate of the surface acoustic wave element 2 to be constant. That is, since the minimum width of the barriers 9 and 10 is tens of micrometers, it is desirable to use a photosensitive resin in order to form the barriers 9 and 10 at a fixed location precisely. When there are local variations in height, since the spacing becomes uneven, a material having small bumps and dips and also having small particles in size is desirable. Moreover, after the barriers 9 and 10 have been formed, since, for example, a cleaning process, a coating process of the sealing resin, and a heating process are performed, it is required that the material withstand these processes and also have chemical resistance so that the material can withstand the compounds in the sealing resin 5.

The height h1 of the outer barrier 9 is preferably lower than the total height h4 (=h2+h3) of the height h2 of the bumps 4 after being connected and the height h3 of the electrode lands 8 disposed on the mounting surface of the mounting board 3, and the height h5 of the inner barrier 10 is preferably lower than the height h2 of the bumps 4 after being connected. At this time, since the height h1 of the outer barrier 9 is preferably lower than the total height h4 of the height h2 of the bumps 4 after being connected and the height h3 of the electrode lands 8 disposed on the mounting surface of the mounting board 3, a small gap is secured between the outer barrier 9 and the mounting surface of the mounting board 3.

Moreover, when the height h1 of the outer barrier 9 is higher than the total height h4 of the height h2 of the bumps 4 after being connected and the height h3 of the electrode lands 8 disposed on the mounting surface of the mounting board 3, since the bumps 4 cannot be pressed as much as the thickness (height) of the outer barrier 9, a sufficient connecting strength cannot be obtained when the mounting board 3 and the surface acoustic wave element 2 are connected. That is, when the surface acoustic wave element 2 is flip-chip bonded to the mounting board 3, in order to obtain a sufficient connecting strength of the pressed bumps 4, it is required to secure a gap S between the outer barrier 9 and the mounting board 3 and, in the present preferred embodiment in which the height h1 of the outer barrier 9 is preferably lower than the total height h4 of the height h2 of the bumps 4 after being connected and the height h3 of the electrode lands 8 disposed on the mounting surface of the mounting board 3, since the gap S can be secured between the outer barrier 9 and the mounting surface of the mounting board 3, a sufficient connecting strength can be obtained.

It is desirable that the gap S between the outer barrier 9 and the mounting surface of the mounting board 3 be about 0 to about 15 μm. Furthermore, when the height h5 of the inner barrier 10 is lower than the height h2 of the bumps 4 after being connected, the inner barrier 10 can be prevented from coming into contact with the electrode lands 8 disposed on the mounting surface of the mounting board 3. Moreover, if the height h5 of the inner barrier 10 is higher than the height h2 of the bumps 4 after being connected, the inner barrier 10 comes into contact with the electrode lands 8 of the mounting board 3 and, since the bumps 4 cannot be pressed, it becomes difficult to obtain a sufficient connecting strength between the mounting board 3 and the surface acoustic wave element 2.

Furthermore, the height h5 of the inner barrier 10 can be reduced by making the width of the barrier 10 larger than the spreading width of the sealing resin 5. Furthermore, when the outer barrier 9 is a laminate of a lower layer 9a and an upper layer 9b, it is desirable that the lower layer 9a and the inner barrier 10 have the same height h5. In this way, the lower layer 9a of the outer barrier 9 and the inner barrier 10 can be formed in the same process and, since the outer barrier 9 made of the lower layer 9a and the upper layer 9b is formed in two separate processes, the outer barrier 9 can be formed with a high aspect ratio.

In the surface acoustic wave device 1 according to the present preferred embodiment, the outer barrier 9 on the functional surface of the surface acoustic wave element 2 is provided outside the bumps 4 and the above-described relationship among the heights is adopted. As a result, the outer barrier 9 faces the mounting board 3 itself, that is, the exposed mounting board 3 in which the electrode lands 8 are not formed, and a gap S having a uniform spacing of (h4−h1) is secured between the outer barrier 9 and the mounting surface of the mounting board 3. Therefore, even if the sealing resin 5 for sealing the outer peripheral edge of the surface acoustic wave element 2 reaches the outer barrier 9, since the gap S between the outer barrier 9 and the mounting surface of the mounting board 3 has a uniform spacing, the inflow of the sealing resin 5 across the outer barrier 9 does not occur.

Then, even if the sealing resin 5 flows in across the outer barrier 9, since the inner barrier 10 having the height h5, which is lower than the height h2 of the bumps 4 after being connected, is provided so as to enclose the vibrating portion 6, a small quantity of the sealing resin 5 flowing over the outer barrier 9 can be surely prevented from flowing in so as to reach the vibrating portion 6 of the surface acoustic wave element 2 over the inner barrier 10. Furthermore, at this time, when the inner barrier 10 is made of a material that is inferior in wettability against the sealing resin 5, low molecular components in the sealing resin 5, which are difficult for the outer barrier 9 to prevent from flowing in, can be surely prevented from flowing in onto the functional surface of the surface acoustic wave element 2.

Moreover, in the present preferred embodiment, although the outer barrier 9 is disposed so as to enclose the all bumps 4 and the inner barrier 10 is disposed to enclose only the vibrating portion 6, it is not limited to such a structure. The outer barrier 9 is disposed so as to enclose a portion of the bumps 4 and the vibrating portion 6 and the inner barrier 10 may enclose at least the vibrating portion 6. That is, it is enough for the outer barrier 9 to be disposed so as to face the mounting surface of the mounting board 3 and, as a result, it is enough that a gap S having a uniform spacing is secured between the outer barrier 9 and the mounting surface of the mounting board 3.

Here, it is enough for the inner barrier 10 to be able to prevent the sealing resin 5 coming over the outer barrier 9 from flowing to the vibrating portion 6 of the surface acoustic wave element 2, and it is enough for the inner barrier 10 to be disposed to enclose at least the vibrating portion 6. Furthermore, in the present preferred embodiment, although the outer barrier 9 and the inner barrier 10 are formed by using a material that is inferior in wettability against the sealing resin 5, both of these are not required to be inferior in wettability against the sealing resin 5. That is, since a material inferior in wettability against the sealing resin 5 is particularly effective in preventing the inflow of low molecular components in the sealing resin 5, when the inner barrier 10 where the inflow of the sealing resin 5 is required to be surely prevented is inferior in wettability against the sealing resin 5, a regular photoresist material may be used for forming the outer barrier 9.

Moreover, when the outer barrier 9 disposed on the functional surface of the surface acoustic wave element 2 includes a laminate of the lower layer 9a and the upper layer 9b, the lower layer 9a may be formed by using the same metal material as the vibrating portion 6 of the surface acoustic wave element 2, that is, the IDT, etc. However, the outer barrier 9 is not required to be a laminate and, as shown in FIG. 4, the outer barrier 9 may be integrally formed as a barrier having the height h1 from the beginning.

Moreover, in the present preferred embodiment, as shown in FIG. 1, only the outer peripheral edge of the surface acoustic wave element 2 is sealed by the sealing resin 5 and the top surface of the surface acoustic wave element 2 is exposed to the outside, but it is not limited to such a structure, and not only the outer peripheral edge of the acoustic wave element 2, but also the top surface may be sealed by the sealing resin 5. Moreover, it is desirable that the sealing resin 5 have a viscosity of about 15 Pa·s to about 150 Pa·s under the temperature at coating and, when the sealing resin 5 has such a viscosity, the inflow of the sealing resin 5 can be more securely prevented. That is, when the sealing resin 5 has a low viscosity, the inflow becomes more likely to occur and, when the sealing resin 5 has a high viscosity, since bubbles that worsen the sealing property are likely to occur, the lower limit of the viscosity is determined by the inflow of the sealing resin 5 to the vibrating portion 6 and the upper limit is determined by the occurrence of the bubbles.

Now, in the present preferred embodiment, it is possible to adopt the following modified examples. First, as shown in FIG. 5, a step portion may be formed in the outer barrier 9 by forming a groove (concave portion) 9c having a fixed width in the outer barrier 9 provided in the functional surface of the surface acoustic wave element 2. When constructed in this way, even if the inflow of the sealing resin 5 cannot be prevented at the outside corner portion of the outer barrier 9, it becomes possible to prevent the inflow of the resin 5 at the inside corner portion. Moreover, when a step portion is provided by forming a convex portion in the outer barrier 9, the same effect can also be obtained.

Furthermore, as shown in FIG. 6, between the outer barrier 9 and the inner barrier 10, an outer barrier (second outer barrier) 11 may be provided so as to be next to the outer barrier (first outer barrier) 9. When constructed in this way, even if the inflow of the sealing resin 5 cannot be prevented by the outer barrier 9, it becomes possible to prevent the inflow of the sealing resin 5 by the outer barrier (second outer barrier) 11.

Figure 24:
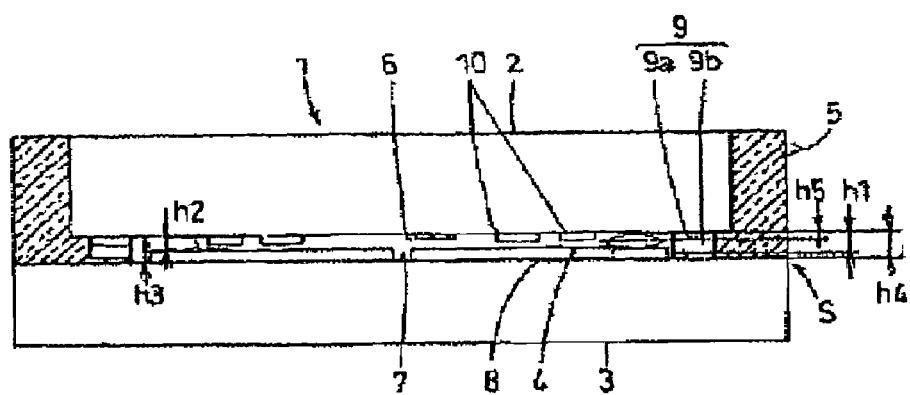
FIG. 24 is a transverse sectional view showing the structure of a surface acoustic wave device according to another preferred embodiment of the present invention.

Moreover, although not illustrated, a groove having a fixed width may be formed in the inner barrier 10 and, when constructed in this way, even if the size of the inner barrier 10 is not changed, the separating distance between the inner barrier 10 and the vibrating portion 6 becomes large and, as a result, the sealing resin 5 does not reach the vibrating portion 6. Furthermore, as shown in FIG. 24, a second inner barrier 10 may be provided inside the inner barrier (first inner barrier) 10 so as to be next to the inner barrier 10. When constructed in this way, since the separating distance between the inner barrier (first inner barrier) 10 and the vibrating portion 6 is increased by the second inner barrier 10, the inflow of the sealing resin 5 to the vibrating portion 6 can be securely prevented.

Furthermore, in this case, it is desirable that the height of the second inner barrier 10 be nearly the same as that of the inner barrier (first inner barrier) 10 and that the second inner barrier 10 be formed by using the same material as the inner barrier (first inner barrier) 10. That is, when constructed in this way, the second inner barrier 10 can be formed in concurrence with the inner barrier (first inner barrier) 10.

Next, the manufacturing method for the surface acoustic wave device 1 and surface acoustic wave element 2 according to the first preferred embodiment is simply described based on FIGS. 7 and 8.

First, as shown in FIG. 7 in which a manufacturing process of a surface acoustic wave element is illustrated, a piezoelectric substrate 12 ($LiTaO_3$ wafer) having a plurality of bumps 4 and vibrating portions 6 (not illustrated), from which many surface acoustic wave elements 2 are produced by dicing, is prepared and the outer barrier 9 and inner barrier 10 are formed on each surface-acoustic-wave-element area 13 where the bumps 4 and the vibrating portion have been formed. Moreover, the piezoelectric substrate 12 may be made of any other material such as $LiNbO_3$, instead of $LiTaO_3$.

Furthermore, it is possible to use a dielectric substrate on the surface of which a piezoelectric thin film such as ZnO, etc., is formed can be used instead of the piezoelectric substrate 12. Furthermore, in the above description, although the outer barrier 9 and the inner barrier 10 are formed on the surface-acoustic-wave-element area 13 where the bumps 4 are formed, the bumps 4 may be formed after the outer barrier 9 and the inner barrier 10 have been formed.

That is, on the $LiTaO_3$ wafer as the piezoelectric substrate 12 having the vibrating portion 6 of the IDT, reflector, etc., formed thereon, the lower layer 9a of the outer barrier 9 disposed so as to enclose the bumps 4 and the vibrating portion 6 and the inner barrier 10 disposed to enclose only the vibrating portion 6 are simultaneously formed by a photoresist method so that the height h5 may be lower than the height h2 of the bumps 4 after being connected. Next, the upper layer 9b is laminated on the lower layer 9a of the outer barrier 9 so as to define a height (h1–h5) which is higher than the height h3 of the electrode lands 8 formed on the mounting surface of the mounting board 3.

As a result, in each surface-acoustic-wave-element area 13 in the piezoelectric substrate 12, the outer barrier 9 having the height h1 which encloses the bumps 4 and the vibrating portion 6 and the inner barrier 10 having the height h5 which encloses only the vibrating portion 6 are formed. After that, when the $LiTaO_3$ wafer as the piezoelectric substrate 12 is diced into chip-sized pieces, a surface acoustic wave element 2 corresponding to each surface-acoustic-wave-element area is produced.

Now, when an outer barrier (second outer barrier) 11 is provided between the outer barrier (first outer barrier) 9 and the inner barrier 10 provided on the functional surface of the acoustic wave element 2, and when a second inner barrier is provided inside the inner barrier (first inner barrier) 10, the outer barrier (second outer barrier) 11 and second inner barrier are formed together with the outer barrier (first outer barrier) 9 and inner barrier (first inner barrier) 10 on each surface-acoustic-wave-element area 13 of the piezoelectric substrate 12.

Furthermore, electrode lands 8 are formed in advance on an area corresponding to each of the surface acoustic wave elements 2, that is, on an area 14 corresponding to the element, and thus a composite substrate 15 from which the mounting board 3 is produced later is prepared. Then, as shown in FIG. 8, each of the surface acoustic wave elements 2 which were produced by dicing is flip-chip bonded and mounted on an area 14 corresponding to the element. After that, although not illustrated, a sealing resin 5 is coated and hardened around each surface acoustic element 2 mounted on a composite substrate 15 and the composite substrate 15 is diced to chip-size pieces to produce a surface acoustic wave device 1 having the structure shown in FIG. 1.

Second Preferred Embodiment

Figure 9:
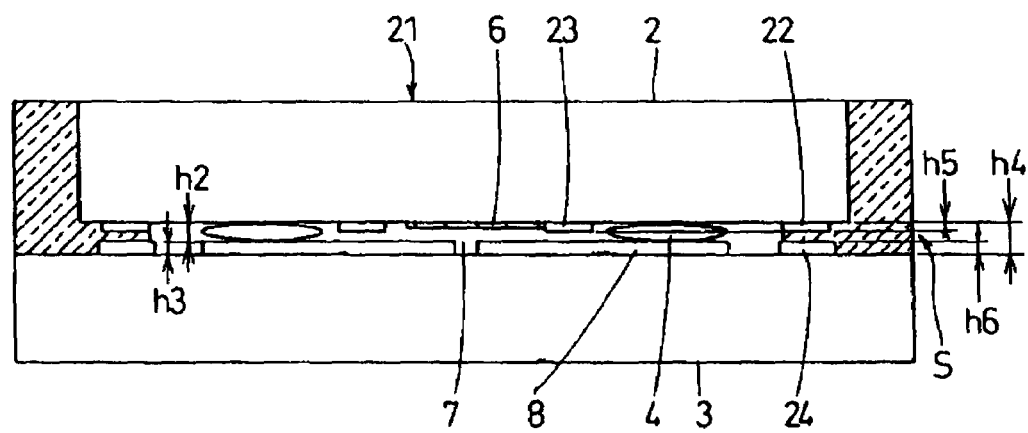
FIG. 9 is a transverse sectional view showing the structure of a surface acoustic wave element according to a second preferred embodiment of the present invention.
Figure 10:
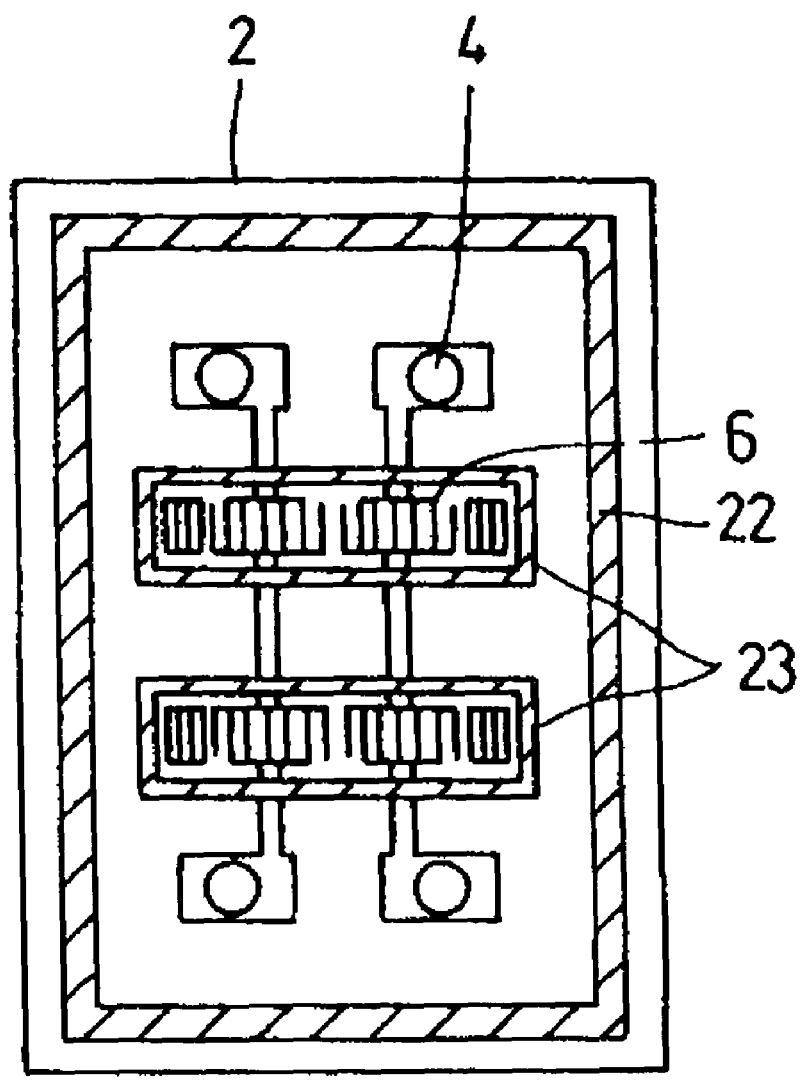
FIG. 10 is a top view showing the structure of a surface acoustic wave element according to the second preferred embodiment of the present invention.
Figure 11:
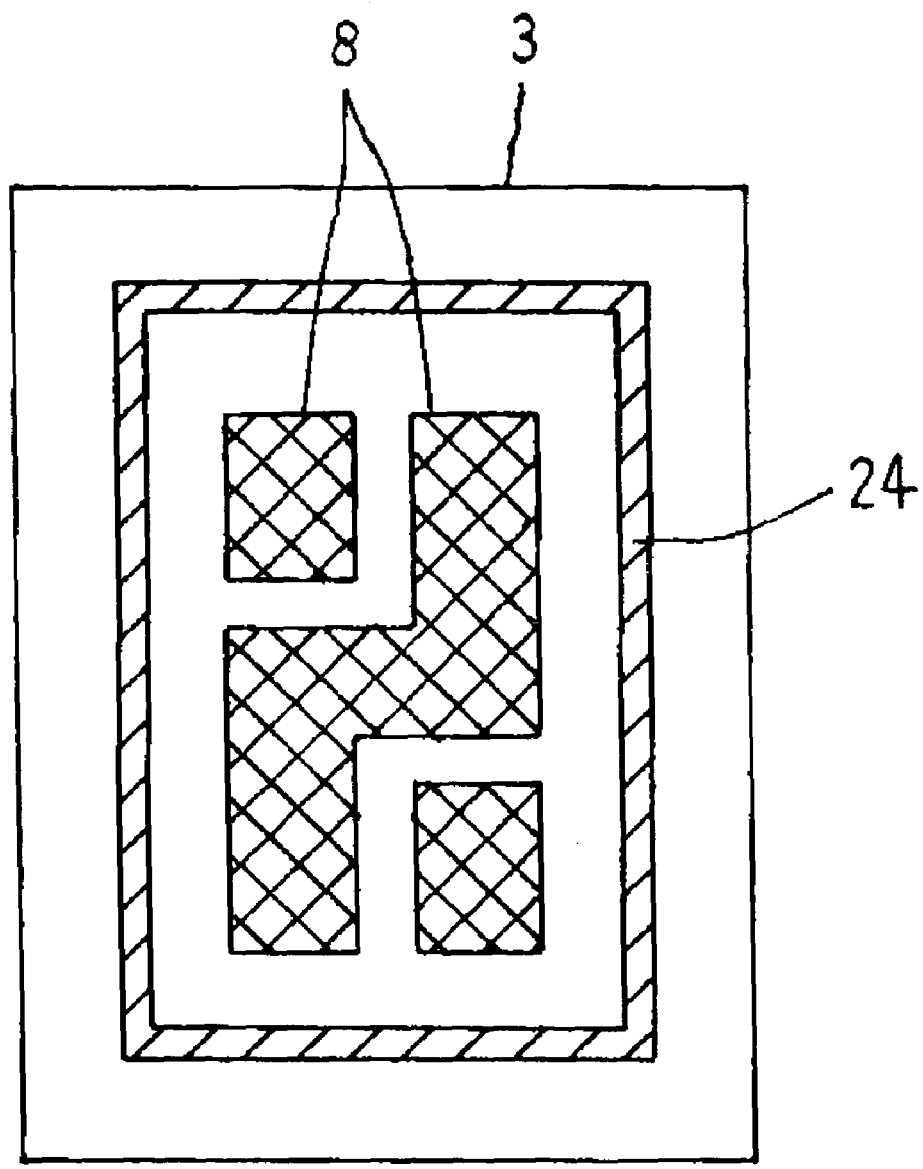
FIG. 11 is a top view showing the structure of a mounting board according to the second preferred embodiment of the present invention.
Figure 12:
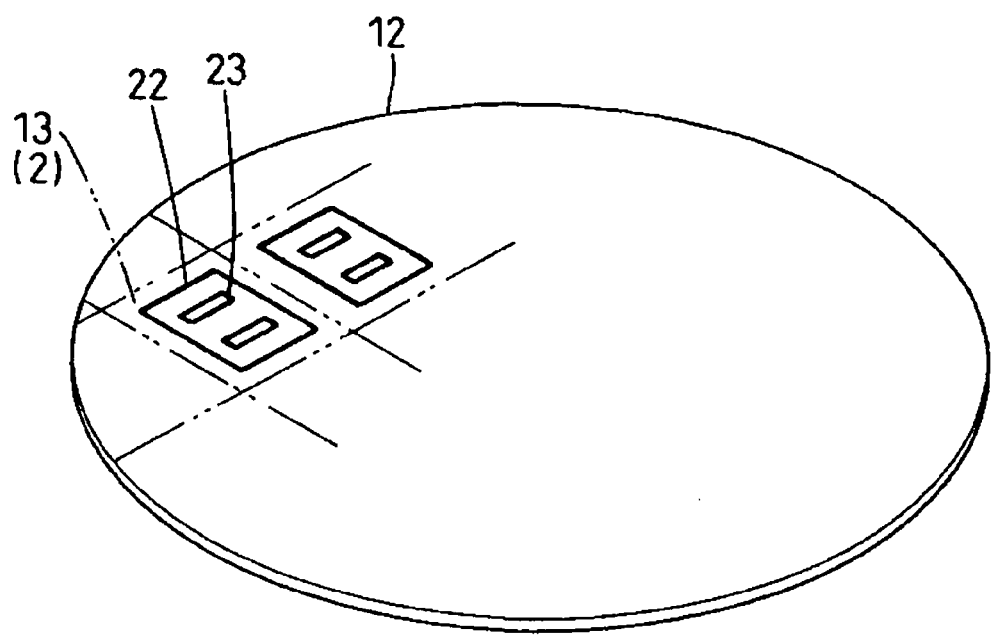
FIG. 12 shows the manufacturing process of the surface acoustic wave element according to the second preferred embodiment of the present invention.
Figure 13:
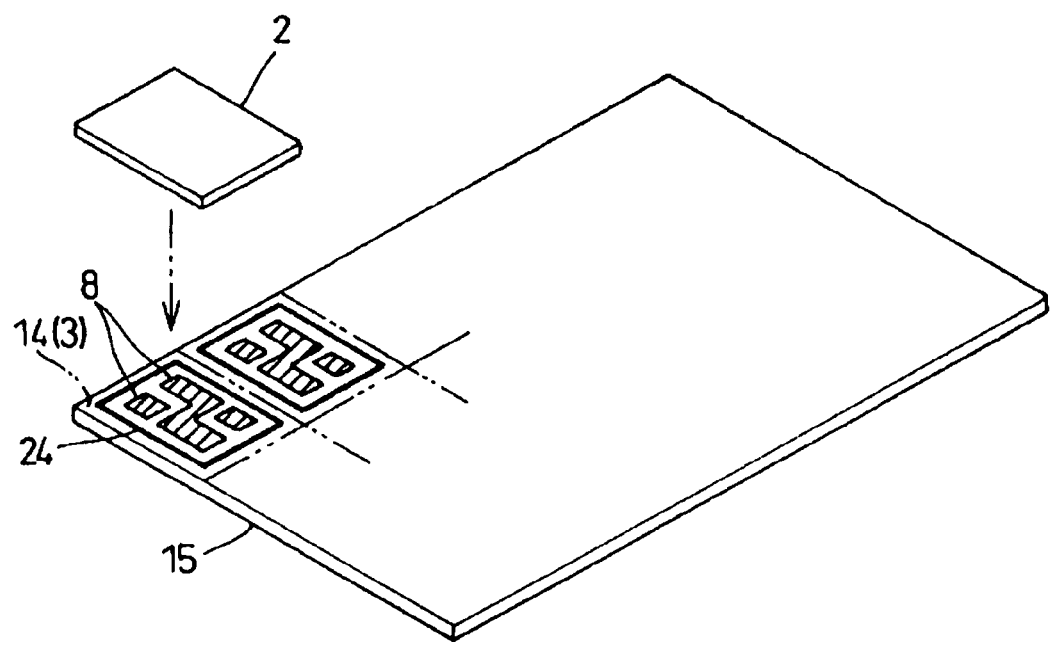
FIG. 13 shows the manufacturing process of a surface acoustic wave device according to the second preferred embodiment of the present invention.

FIG. 9 is a transverse sectional view showing the structure of a surface acoustic wave device according to a second preferred embodiment, FIG. 10 is a top view showing the structure of a surface acoustic wave element, and FIG. 11 is a top view showing the structure of a mounting board. FIG. 12 shows the manufacturing process of the surface acoustic wave element of the second preferred embodiment and FIG. 13 shows the manufacturing process of a surface acoustic wave device. Moreover, since the whole structure of the surface acoustic wave device according to second preferred embodiment is basically not different from the first preferred embodiment, in FIGS. 9 to 13, the same elements as or equivalent ones to those in FIGS. 1 to 8 are given the same reference numerals and their detailed description is omitted.

In a surface acoustic wave device 21 according to second preferred embodiment, as shown in FIG. 9, the functional surface of the surface acoustic wave element (SAW device chip) 2 is connected to the mounting surface of the mounting board 3 through the bumps 4 and only the outer peripheral edge of the surface acoustic wave element 2 is sealed. A vibration space 7 is secured between the vibrating portion 6 formed on the functional surface of the surface acoustic wave element 2, that is, the vibrating portion 6 of the surface acoustic wave element 2 which includes the IDT, reflector, and wiring portion, and the mounting surface of the mounting board 3 made of a dielectric material such as alumina, etc. Moreover, the IDT, reflector, and wiring portion of the surface acoustic wave element 2 in FIG. 10 are schematically shown. Thus, these actual shapes may be different from those in the drawing.

Furthermore, on the functional surface of the surface acoustic wave element 2, as shown in FIG. 10, both an outer barrier 22 and an inner barrier 23 are provided inside and outside in order to prevent the sealing resin 5 such as an epoxy resin, etc., which seals a gap between the surface acoustic wave element 2 and the mounting surface of the mounting board 3, from flowing to the vibrating portion 6 of the surface acoustic wave element 2. That is, on the functional surface of the surface acoustic wave element 2, an outer barrier 22 disposed at an outer location which encloses the bumps 4 and the vibrating portion 6 and having a substantially rectangular shape when viewed from the top and an inner barrier 23 disposed at an inner location which encloses only the vibrating portion 6 and having a substantially rectangular shape when viewed from the top are provided. Moreover, the outer barrier 22 preferably has the same height h5 as that of the inner barrier 23 and h5 is preferably lower than the height h2 of the bumps 4 after being connected (h5<h2).

On the other hand, on the mounting surface of the mounting board 3, as shown in FIG. 11, electrode lands for connecting the bumps 4 are disposed at fixed locations, and a board-side barrier 24 is arranged so as to enclose the bumps 4 and the vibrating portion 6 on the functional surface of the surface acoustic wave element 2 is arranged to face the outer barrier 22 formed in the surface acoustic wave element 2. Furthermore, the height h6 of the board-side barrier 24 is preferably set such that the total height h7 (=h5+h6) of the height h5 of the outer barrier 22 and the height h6 of the board-side barrier 24 is lower than the total height h4 (=h2+h3) of the height h2 of the bumps 4 after being connected and the height h3 of the electrode lands 8 formed on the mounting surface of the mounting board 3.

Since the outer barrier 22, the inner barrier 23, and the board-side barrier 24 have the above-described relationship among the heights, a gap S having a uniform spacing of (h4–h7) is secured between the outer barrier 22 disposed on the functional surface of the surface acoustic wave element 2 and the board-side barrier 24 disposed on the mounting surface of the mounting board 3. As a result, even if the bumps 4 are pressed when the surface acoustic wave element 2 is flip-chip bonded to the mounting board 3, the outer barrier 22 and the board-side barrier 24, which are arranged so as to face each other, do not come into contact with each other and it becomes possible to obtain a sufficient connecting strength for the bumps 4.

In the surface acoustic wave device 21, even if the sealing resin 5 for sealing the outer peripheral edge of the surface acoustic wave element 2 reaches the outer barrier 22 and the board-side barrier 24, since the gap S between the outer barrier 22 and the board-side barrier 24 is uniform, the sealing resin does not flow in over the outer barrier 22 and the board-side barrier 24. Furthermore, even if the sealing resin 5 flows in over the outer barrier 22 and the board-side barrier 24, since the inner barrier 23 encloses the vibration portion 6 of the surface acoustic wave element 2, a small quantity of the sealing resin 5 which comes over the outer barrier 22 is securely prevented from flowing to the vibrating portion 6.

Moreover, it is desirable that the gap S between the outer barrier 22 and the mounting board 3 be about 0 to about 15 µm. That is, although the outer barrier 22 comes partially in contact with the mounting board 3 because of the bending and tilting of the mounting board 3, the inflow of the sealing resin 5 can be prevented by setting the average spacing of the gap S to the above value.

Furthermore, it is desirable that, among the outer barrier 22, the inner barrier 23, and the board-side barrier 24, at least the inner barrier 23 is formed by using a material that is inferior in wettability against the sealing resin 5 to the functional surface of the surface acoustic wave element 2 and the mounting surface of the mounting board 3, for example, a photoresist polyimide, etc., as in the first preferred embodiment. When constructed in this way, it becomes possible for low molecular components in the sealing resin 5, which were difficult to prevent from flowing in by the outer barrier 22 and the board-side barrier 24, to be reliably prevented from flowing along the functional surface of the surface acoustic wave element 2.

A material that is inferior in wettability against the sealing resin 5 is effective in preventing low molecular components in the sealing resin 5 from flowing in, and, when the inner barrier 23, which is required to reliably prevent the sealing resin 5 from flowing in, is made of a material inferior in wettability against the sealing resin 5, the outer barrier 22 and the board-side barrier 24 are not necessarily required to be inferior in wettability against the sealing resin 5. Therefore, when the inner barrier 23, which is required to surely prevent the sealing resin 5 from flowing in, is inferior in wettability against the sealing resin 5, regular photoresist materials may be used to form the outer barrier 22. Furthermore, a material for forming the outer barrier 22, the inner barrier 23, and the board-side barrier 24 that is excellent in heat resistance (260° C.) during reflow is desirable.

Now, although not illustrated, also in the second preferred embodiment, the same modifications as in the first preferred embodiment can be adopted. That is, the outer barrier 22 provided on the functional surface of the surface acoustic wave element 2 is disposed so as to enclose some of the bumps 4 and the vibrating portion 6, and the inner barrier 23 may be disposed so as to enclose at least the vibrating portion 6. Furthermore, a groove is formed in each of the outer barrier 22 and the inner barrier 23, a second outer barrier is provided between the outer barrier 22 and the inner barrier 23, and a second inner barrier may be provided inside the inner barrier 23.

Next, the manufacturing method for the surface acoustic wave device 21 and surface acoustic wave element 2 according to the present preferred embodiment is simply described based on FIGS. 12 and 13.

First, as shown in FIG. 12 in which the manufacturing process of a surface acoustic wave element is illustrated, a piezoelectric substrate 12 ($LiTaO_3$ wafer) having a plurality of bumps 4 and vibrating portions 6 (not illustrated), from which many surface acoustic wave elements 2 are produced by dicing, is provided, and the outer barrier 22 and the inner barrier 23 are formed on each surface-acoustic-wave-element area where the bumps 4 and the vibrating portion 6 are formed. Moreover, a substrate made of not only $LiTaO_3$, but also $LiNbO_3$, etc., may be used as the piezoelectric substrate 12.

Furthermore, although the piezoelectric substrate 12 is used here, instead of the piezoelectric substrate 12, it is possible to use a dielectric substrate on which a piezoelectric thin film of ZnO, etc., is formed. Moreover, although the outer barrier 22 and the inner barrier 23 are formed in a surface-acoustic-wave-element area where the bumps 4 are formed, a process in which the bumps 4 are formed after the outer barrier 22 and the inner barrier 23 have been formed may be used.

That is, on the $LiTaO_3$ wafer as the piezoelectric substrate 12 on which the vibrating portion 6 made of the IDT and the reflector is formed, the outer barrier 22 disposed so as to enclose the bumps 4 and the vibrating portion 6 and the inner barrier 23 disposed to enclose only the vibrating portion 6 are simultaneously formed by a photoresist method using a photosensitive polyimide resin, etc., so that the height h5 of the barriers 22 and 23 may be lower than the height h2 of the bumps 4 after being connected.

Next, the $LiTaO_3$ wafer as the piezoelectric substrate 12 is diced into chip-size pieces and surface acoustic wave elements 2 corresponding to surface-acoustic-wave-element areas, respectively, are produced. On the other hand, electrode lands 8 are formed in advance in an area corresponding to each surface acoustic wave element 2, that is, an area 14 corresponding to the element, and a composite substrate 15, from which mounting substrates 3 are produced later, is prepared and, as shown in FIG. 13, a board-side barrier 24 is formed at a location facing the outer barrier 22 at each area 14 corresponding to the element of the composite substrate 15, that is, at a location facing the outer barrier 22 formed in the surface acoustic wave element 2.

After that, each surface acoustic wave element 2 produced by dicing is mounted at each area 14 corresponding to the element of the composite substrate 15 by flip-chip bonding. Next, although not illustrated, after the sealing resin 5 has been coated around each surface acoustic wave element 2 mounted on the composite substrate 15 and hardened, when the composite substrate 15 is diced and divided into chip-size pieces, the surface acoustic wave device 21 having the structure shown in FIG. 9 is provided.

Third Preferred Embodiment

Figure 14:
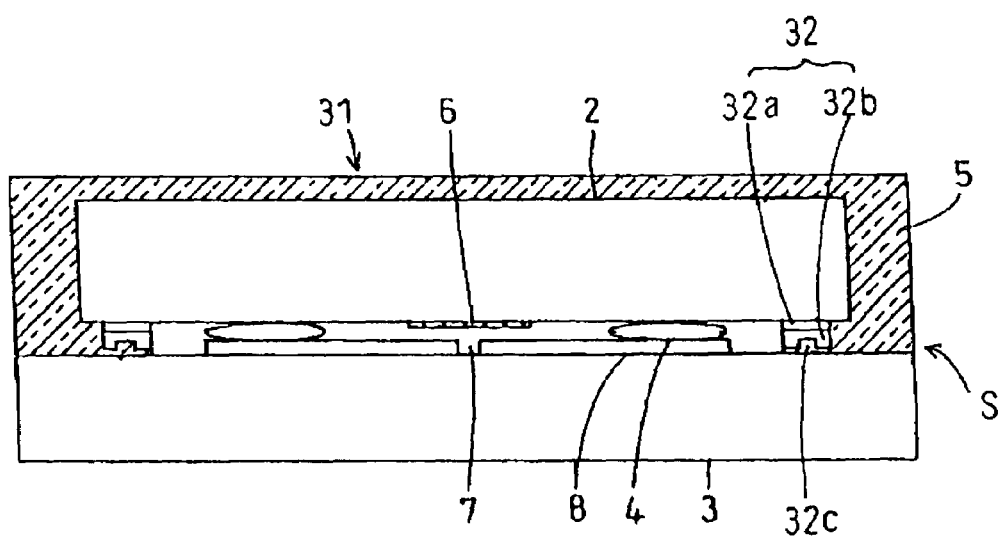
FIG. 14 is a transverse sectional view showing the structure of a surface acoustic wave device according to a third preferred embodiment of the present invention.
Figure 15:
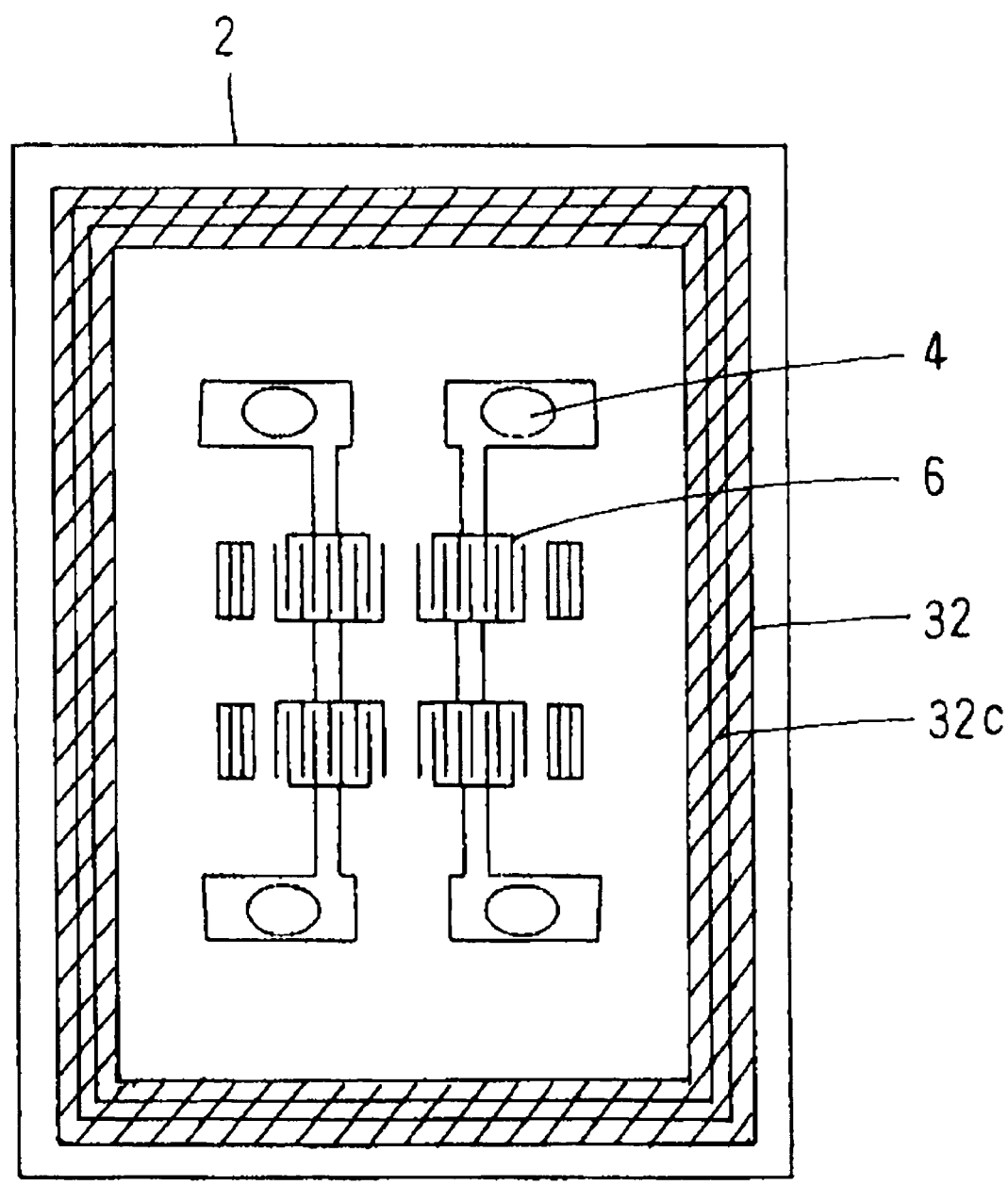
FIG. 15 is a top view showing the structure of a surface acoustic wave element according to the third preferred embodiment of the present invention.
Figure 16:
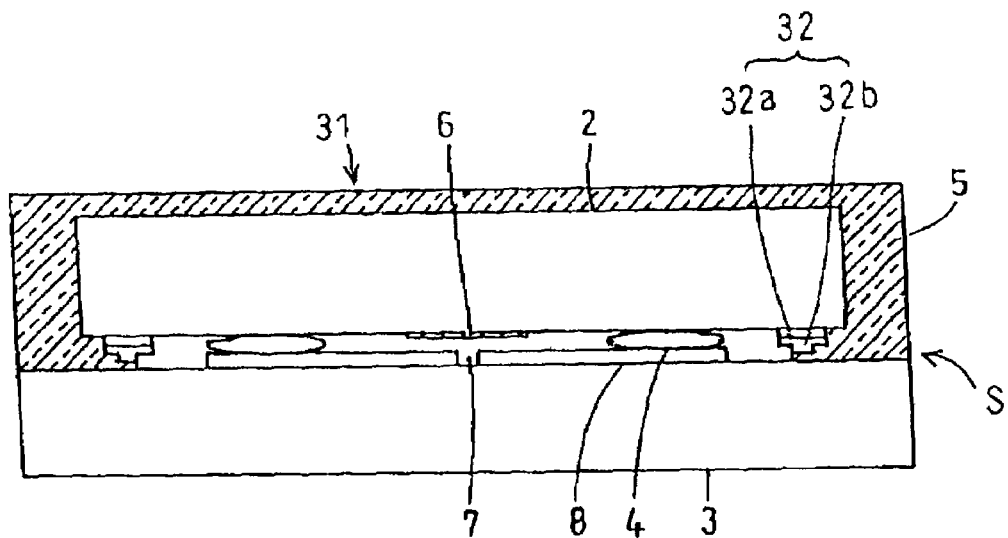
FIG. 16 is a transverse sectional view showing the structure of a surface acoustic wave device according to a modified example of the third preferred embodiment of the present invention.

FIG. 14 is a transverse sectional view showing the structure of a surface acoustic wave device according to third preferred embodiment, FIG. 15 is a top view showing the structure of a surface acoustic wave element, and FIG. 16 is a transverse sectional view showing the structure of a surface acoustic wave device according to a modified example of third preferred embodiment. Moreover, since the whole structure of the surface acoustic wave device according to third preferred embodiment is basically not different from the first preferred embodiment, in FIGS. 14 to 16, the same elements as or equivalent ones to those in FIGS. 1 to 8 are given the same reference numerals and their detailed description is omitted.

In a surface acoustic wave device 31 according to third preferred embodiment, as shown in FIG. 14, the functional surface of the surface acoustic wave element (SAW device chip) 2 is connected to the mounting surface of the mounting board 3 through the bumps 4, and the outer peripheral edge and top surface of the surface acoustic wave element 2 are sealed by the sealing resin 5. A vibration space 7 is secured between the vibrating portion 6 disposed on the functional surface of the surface acoustic wave element 2, that is, the vibrating portion 6 of the surface acoustic wave element 2 which includes the IDT, reflector, and wiring portion, and the mounting surface of the mounting board 3 made of a dielectric material such as alumina, etc. Moreover, the IDT, reflector, and wiring portion of the surface acoustic wave element 2 in FIG. 15 are schematically shown. Thus, these actual shapes may be different from those in the drawing.

On the other hand, on the mounting surface of the mounting board 3, as shown in FIG. 14, the electrode lands 8 for connecting the bumps 4 at fixed locations are disposed at fixed locations. Furthermore, on the functional surface of the surface acoustic wave element 2, as shown in FIG. 15, an outer barrier 32 which prevents the sealing resin 5 for sealing the space between the surface acoustic wave element 2 and the mounting board 3, for example, the sealing resin 5 composed of epoxy resin, etc., from flowing to the vibrating portion 6 of the surface acoustic wave element 2 is provided. That is, on the functional surface of the surface acoustic wave element 2, the outer barrier 32 having a substantially rectangular shape when viewed from the top is provided so as to enclose the bumps 4 and the vibrating portion 6.

The outer barrier 32 is formed by a photoresist method using a material that is inferior in wettability against the sealing resin 5 to the functional surface of the surface acoustic wave element 2 and the mounting surface of the mounting board 3, for example, a photosensitive polyimide resin, BCB (resin component: benzocyclobutene), Zcoat (resin component: cyclic polyolefin), etc. Then, it is desirable that the material used in the outer barrier 32 be excellent in heat resistance during reflow when the surface acoustic wave device 1 is mounted on a printed circuit board.

Moreover, the reflow temperature is dependent on the solder material. For example, the reflow temperature of a eutectic solder material of Sn—Pb is 180° C. and the reflow temperature of a solder material of Sn—Ag—Cu is 220° C. When these facts are considered, it is sufficient for the material used in the outer barrier 32 to withstand a temperature of about 260° C. Furthermore, as shown in FIG. 14, the outer barrier 32 here has a laminated structure of a lower layer 32a and an upper layer 32b. When constructed in this way, since the upper layer 32b can be formed after the lower layer 32a has been formed, it becomes possible to form a barrier with a high aspect ratio compared with that of a single-layer structure.

Furthermore, the outer barrier 32 is preferably lower than the total height of the bumps 4 after being connected and the electrode lands. Since the outer barrier 32 has the above-described height, a gap S having a uniform spacing is secured between the outer barrier 32 formed on the functional surface of the surface acoustic wave element 2 and the mounting surface of the mounting board 3. As a result, when the surface acoustic wave element 2 is flip-chip bonded to the mounting board 3, even if the bumps 4 are pressed, the outer barrier 32 does not come in contact with the mounting board 3, even though both are arranged so as to face each other, and a sufficient connecting strength of the bumps 4 can be obtained.

In the surface acoustic wave device 31, even if the sealing resin 5 for sealing the outer peripheral edge of the surface acoustic wave element 2 reaches the outer barrier 32, since the gap between the outer barrier 32 and the mounting board 3 is uniform, the sealing resin 5 does not flow in over the outer barrier 32. Moreover, it is desirable that the gap S between the outer barrier 32 and the mounting board 3 be in the range of about 0 to about 15 μm.

Now, as shown in FIGS. 14 and 15, the outer barrier 32 of third preferred embodiment 3 has a groove (concave portion) 32c having a fixed width and, as a result, the outer barrier 32 has a step portion. Therefore, even if the inflow of the sealing resin is not prevented at the outside step portion in the outer barrier 32, the inflow of the sealing resin can be prevented by the inside step portion.

That is, since there is a level difference in the outer barrier 32 because of the groove 32c, the principle of preventing the sealing resin 5 from flowing in is as follows. First, the sealing resin 5 is coated from the direction of the outer peripheral edge of the surface acoustic wave element 2 and, when there is no level difference in the outer barrier 32, the sealing resin 5 flowing over the edge portion of the outer barrier 32 may reach the vibrating portion 6. On the other hand, when there is a level difference in the outer barrier 32, even if the sealing resin 5 runs over the step portion of the outer barrier 32, the sealing resin 5 which runs over the outer barrier 32 reaches the bottom portion of the groove 32.

Then, the edge portion having the level difference has an effect and, because of the surface tension, the sealing resin 5 more easily runs in the direction of the level difference rather than in the direction of the vibrating portion 6. That is, the sealing resin 5 runs in the direction of the extending direction of the groove 32c, but, not toward the vibrating portion 6. Therefore, when the outer barrier 32 having a level difference is provided, the sealing resin 5 can be more securely prevented from flowing in. Moreover, as shown in FIG. 16, even if the step portion is provided in the outer barrier 32 by forming a convex portion in the outer barrier 32, the same effect can be obtained. At this time, the step portion is not necessarily required to be at right angles, but may have a trailing or tapered angle which occurs in the processing.

Furthermore, also in the present preferred embodiment, in the same way as in the second preferred embodiment, it goes without saying that a board-side barrier may be provided at a location at which the board-side barrier faces the outer barrier 32 on the mounting board 3. Moreover, it is desirable that the total height of the outer barrier 32 and the board-side barrier be lower than the total height of the height of the bumps 4 after the surface acoustic wave element 2 and the mounting board 3 have been connected through the bumps 4 and the height of the electrode lands 8 formed on the mounting surface of the mounting board 3.

Fourth Preferred Embodiment

Figure 17:
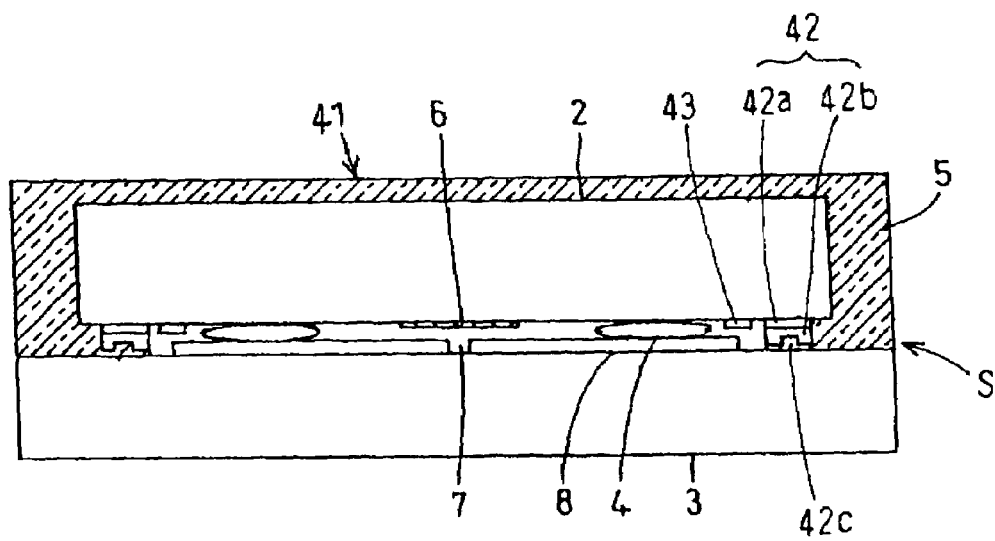
FIG. 17 is a transverse sectional view showing the structure of a surface acoustic wave device according to a fourth preferred embodiment of the present invention.
Figure 18:
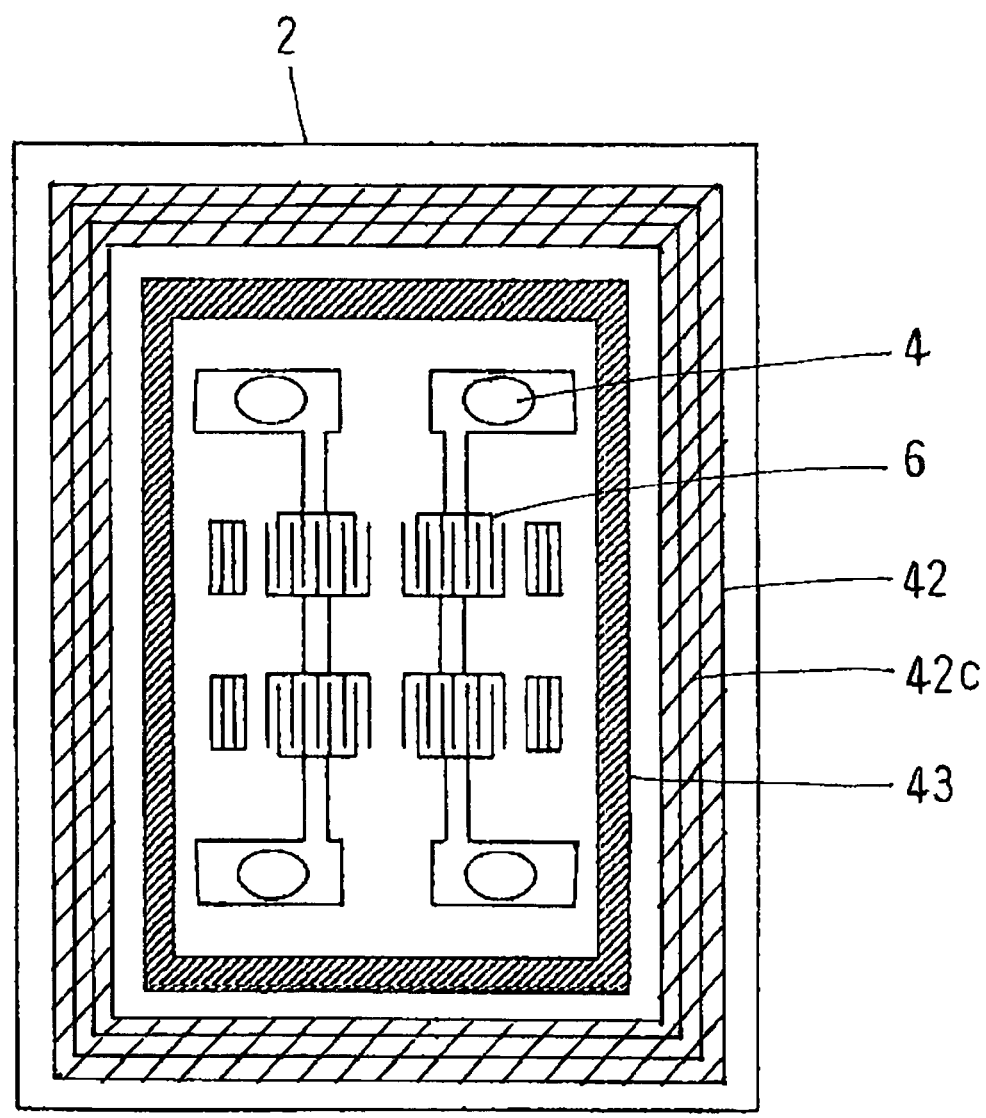
FIG. 18 is a top view showing the structure of a surface acoustic wave element according to the fourth preferred embodiment of the present invention.
Figure 19:
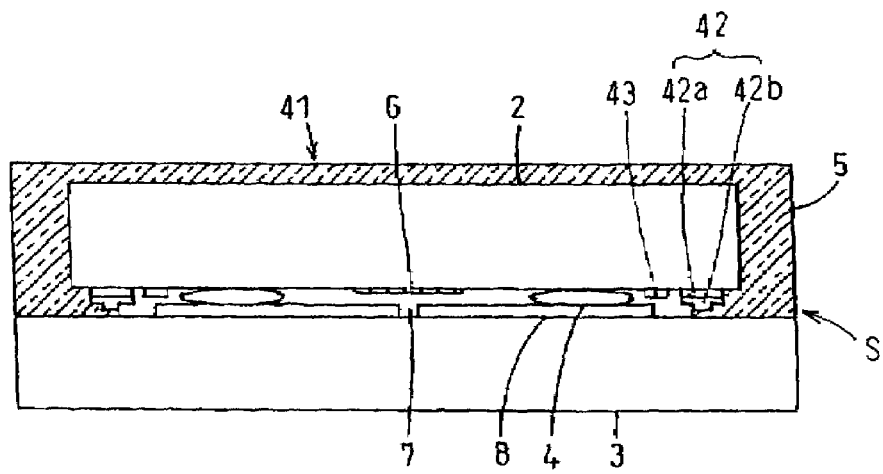
FIG. 19 is a transverse sectional view showing the structure of a surface acoustic wave device according to a first modified example of the fourth preferred embodiment of the present invention.
Figure 20:
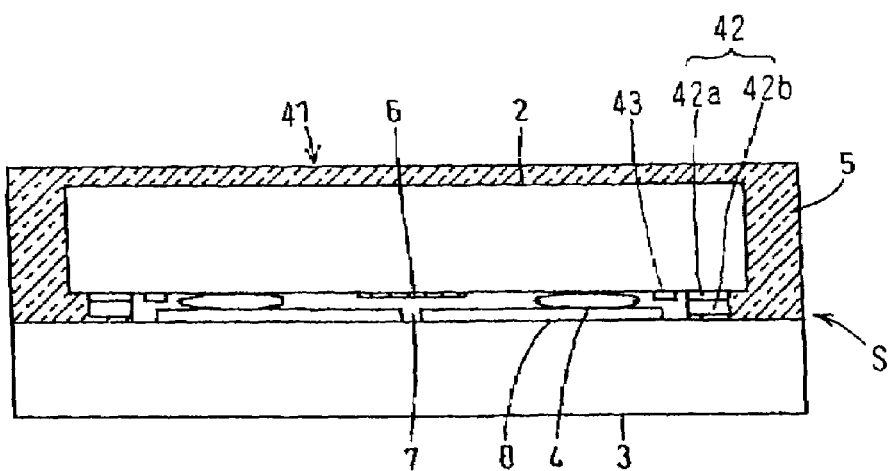
FIG. 20 is a transverse sectional view showing the structure of a surface acoustic wave device according to a second modified example of the fourth preferred embodiment of the present invention.
Figure 21:
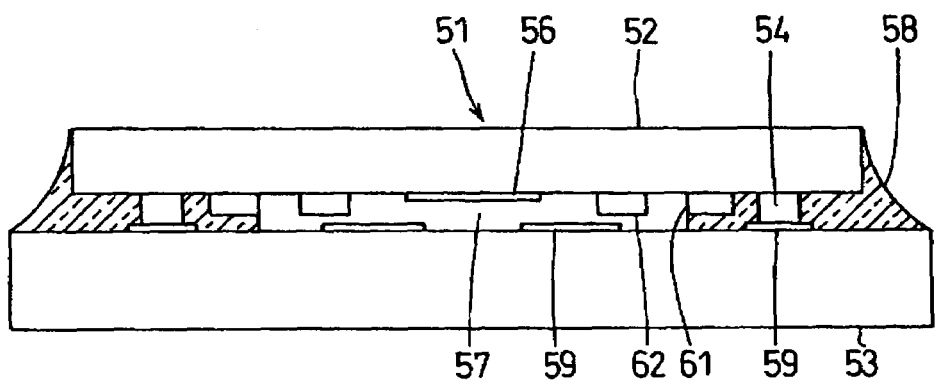
FIG. 21 is a transverse sectional view showing the structure of a surface acoustic wave device according to a related example.
Figure 22:
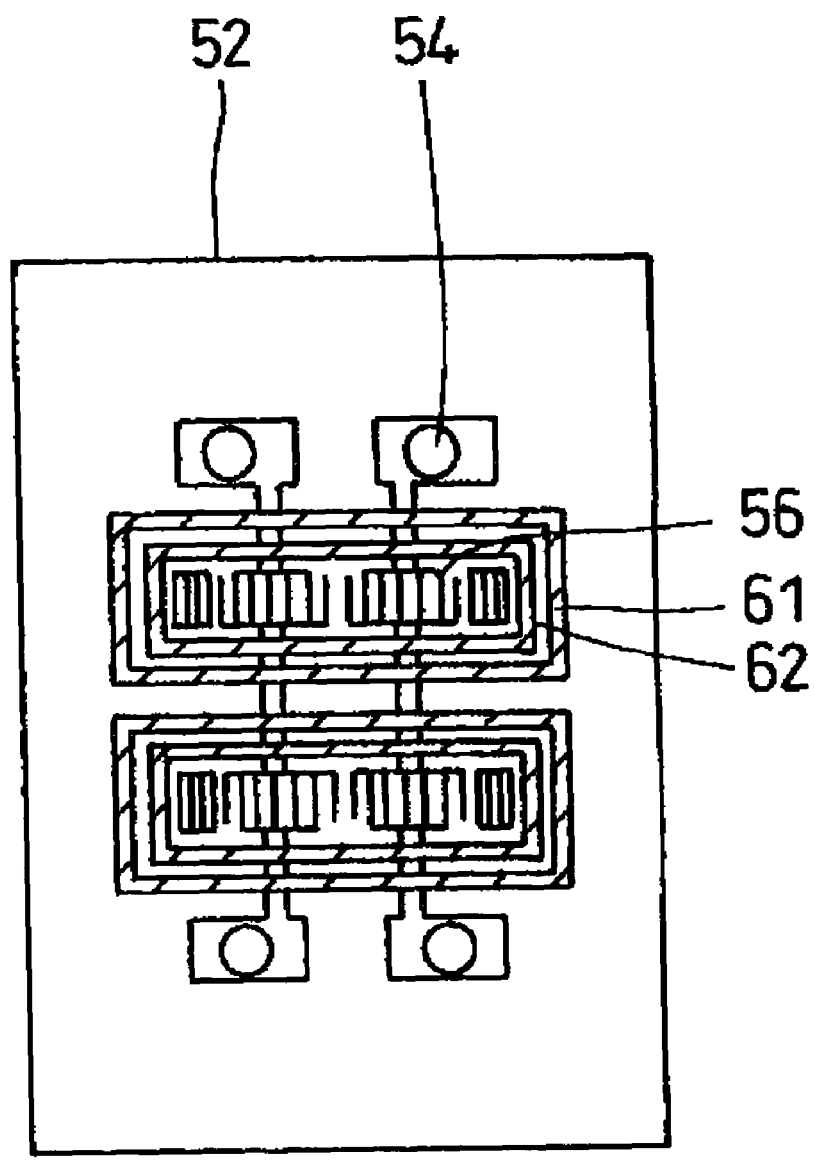
FIG. 22 is a top view showing the structure of a surface acoustic wave element according to a related example.
Figure 23:
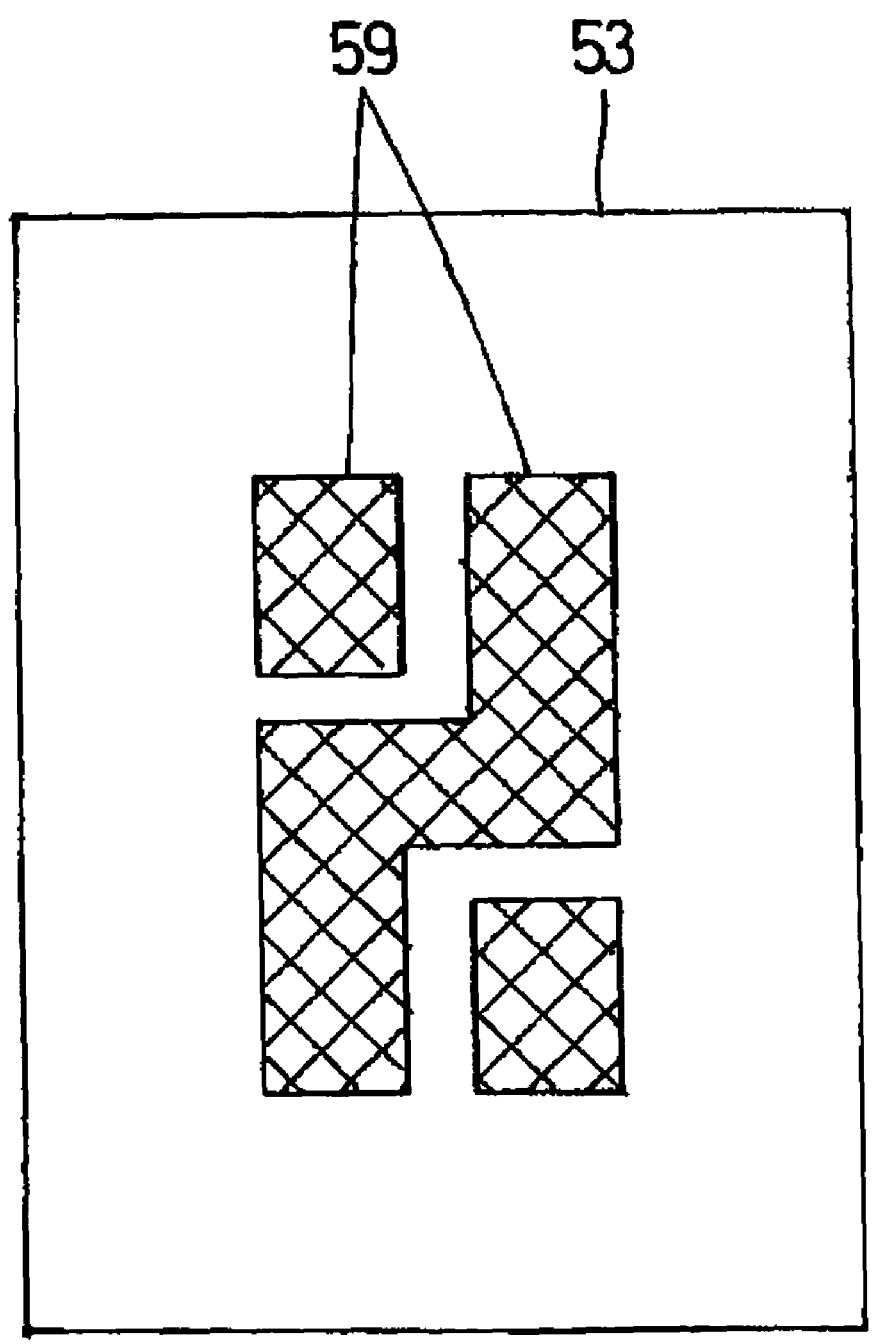
FIG. 23 is a top view showing the structure of a mounting board according to a related example.

FIG. 17 is a transverse sectional view showing the structure of a surface acoustic wave device according to a fourth preferred embodiment, FIG. 18 is a top view showing the structure of a surface acoustic wave element, FIG. 19 is a transverse sectional view showing the structure of a surface acoustic wave device according to a first modified example of the fourth preferred embodiment, and FIG. 20 is a transverse sectional view showing the structure of a surface acoustic wave device according to a second modified example of the fourth preferred embodiment. Since the whole structure of the surface acoustic wave device according to the fourth preferred embodiment is basically not different from the first preferred embodiment, in FIGS. 17 to 20, the same elements as or equivalent ones to those in FIGS. 1 to 8 are given the same reference numerals and their detailed description is omitted.

In a surface acoustic wave device 41 according to the fourth preferred embodiment, as shown in FIG. 17, the functional surface of the surface acoustic wave element (SAW device chip) 2 is connected to the mounting surface of the mounting board 3 through the bumps 4, and the outer peripheral edge and top surface of the surface acoustic wave element 2 are sealed by using the sealing resin 5. Then, a vibration space 7 is secured between the vibrating portion 6 disposed on the functional surface of the surface acoustic wave element 2, that is, the vibrating portion 6 of the surface acoustic wave element 2 including the IDT, reflector, wiring portion, and pad portion, and the mounting surface of the mounting board 3 made of a dielectric material such as alumina, etc. Moreover, the surface acoustic wave element 2 is not limited to the one in which two IDTs are cascade connected.

On the mounting surface of the mounting board 3, as shown in FIG. 17, the electrode lands 8 for connecting the bumps 4 at fixed locations are formed at fixed locations. Furthermore, on the functional surface of the surface acoustic wave element 2, as shown in FIG. 18, a first outer barrier 42 and a second outer barrier 43 are provided to prevent the sealing resin 5 for sealing the gap between the surface acoustic wave element 2 and the mounting board 3, for example, the sealing resin 5 such as an epoxy resin, etc., from flowing to the vibrating portion 6 of the surface acoustic wave element 2. That is, on the functional surface of the surface acoustic wave element 2, the first outer barrier 42 disposed at an outer location which encloses the bumps 4 and the vibrating portion 6 and having a substantially rectangular shape when viewed from the top and the second outer barrier 43 disposed inside the first outer barrier 42 and having a substantially rectangular shape when viewed from the top are provided. Moreover, the corner portions of the first outer barrier 42 and the second outer barrier 43 may be rounded.

Accordingly, in the surface acoustic wave device 41, even if the sealing resin 5 for sealing the outer peripheral edge of the surface acoustic wave element 2 flows in over the first outer barrier 42, since the second outer barrier 43 is provided inside the first outer barrier 42 so as to enclose the bumps 4 and the vibrating portion 6, low molecular components in the sealing resin 5 running over the first outer barrier 42 are prevented from reaching the vibrating portion 6. Moreover, a protective film of $SiO_2$, etc., may be formed on the surface of the surface acoustic wave element 2.

At this time, the first outer barrier 42 and the second outer barrier 43 are preferably formed by a photoresist method using a material that is inferior in wettability against the sealing resin 5 to the functional surface of the surface acoustic wave element 2 and the mounting surface of the mounting board 3, for example, a photosensitive polyimide resin, BCB (resin component: benzocyclobutene), Zcoat (resin component: cyclic polyolefin), etc. Moreover, it is desirable that the material used for forming the first outer barrier 42 and the second outer barrier 43 have excellent heat resistance to the reflow when the surface acoustic wave device 1 is mounted on a printed circuit board by using solder.

However, the reflow temperature is dependent on the solder material to be used. For example, the reflow temperature of a eutectic material of Sn—Pb is 180° C. and the reflow temperature of a solder material of Sn—Ag—Cu is 220° C. When these are considered, it is sufficient for the material used in the outer barrier 32 to withstand a temperature of about 260° C.

Furthermore, as shown in FIG. 17, the first outer barrier 42 has a double-layer structure where a lower layer 42a and an upper layer 42b are laminated. When constructed in this way, since the upper layer 42b can be formed on the lower layer 42a which has been formed, a barrier having a higher aspect ratio can be formed when compared with a single-layer barrier. Moreover, the lower layer 42a of the first outer barrier 42 and the second outer barrier 43 have the same height. Therefore, it becomes possible to form the lower layer 42a of the first outer barrier 42 and the second outer barrier 43 in the same process.

On the other hand, the height of the second outer barrier 43 is preferably lower than the first outer barrier 42, and the first outer barrier 42 is preferably lower than the total height of the bumps 4 after being connected and the electrode lands. Since the first outer barrier 42 and the second outer barrier 43 have the above-described heights, a gap S having a uniform spacing can be secured between the first outer barrier 42 disposed on the functional surface of the surface acoustic wave element 2 and the mounting surface of the mounting board 3.

As a result, even if the bumps 4 are pressed when the surface acoustic wave element 2 is flip-chip bonded to the mounting board 3, the first outer barrier 42 and the second outer barrier 43, which are arranged to face the mounting board 3, do not come into contact with the mounting board 3, and it becomes possible to obtain a sufficient connecting strength of the bumps 4. Therefore, in the surface acoustic wave device 41, even if the sealing resin 5 for sealing the peripheral edge of the surface acoustic wave element 2 reaches the first outer barrier 42, since the gap S between the first outer barrier 42 and the mounting board 3 is uniform, the sealing resin 5 does not flow in over the first outer barrier 42.

Moreover, it is desirable that the width of the gap S between the first outer barrier 42 and the mounting surface of the mounting board 3 be about 0 to about 15 μm.

Furthermore, in the first outer barrier 42, as shown in FIGS. 17 and 18, a groove (concave portion) 42c having a fixed width is formed. As a result, the first outer barrier 42 has a level difference and, even if the peripheral edge portion of the first outer barrier 42 cannot prevent the sealing resin 5 from flowing in, the edge portion located inside the peripheral edge portion can reliably prevent the sealing resin 5 from flowing in.

Here, the principle that the level difference due to the groove 42c formed in the first outer barrier 42 can prevent the sealing resin 5 from flowing in is described. First, although the sealing resin 5 is coated from the direction of the outer peripheral edge of the surface acoustic wave element 2, when there is no level difference in the first outer barrier 42, the sealing resin 5 running over the edge portion of the first outer barrier 42 may reach the vibrating portion 6. However, when there is a level difference in the first outer barrier 42, as soon as the sealing resin 5 runs over the edge portion of the first outer barrier 42, the sealing resin 5 running over the first outer barrier 42 reaches the bottom portion of the groove 42c which makes the level difference.

Therefore, the edge portion making the level difference has an effect and, because of the surface tension, the sealing resin 5 easily runs along the level difference, rather than toward the vibrating portion 6. That is, the sealing resin 5 does not run toward the vibrating portion 6, but the sealing resin 5 runs along the extending direction of the groove 42c. Accordingly, it becomes possible to prevent the sealing resin 5 from flowing in by providing the outer barrier 42 having the level difference. Moreover, as shown in FIG. 19, even if a level difference is provided by forming a convex portion in the first outer barrier 42, the same effect can be obtained. Here, the level difference is not required to be at right angles, but the level difference may have a trailing and tapered angle which occurs in the processing.

Moreover, the structure of the present preferred embodiment has the following advantages. In the structure of the first and second preferred embodiments, since the inner barrier is disposed between the IDT portion and the bumps, the layout of the piezoelectric substrate in the surface acoustic wave element becomes complicated. Thus, the wiring portion on the signal side and the wiring portion on the grounding side come close to each other and, as a result, the capacitance increases. Then, since the characteristics are likely to deteriorate, it is necessary to increase the size of the piezoelectric substrate to avoid the problem. However, since the inner barrier is not provided in the fourth preferred embodiment, it is not necessary to increase the size of the piezoelectric substrate. Furthermore, since the contact between the outer barrier (first outer barrier in the fourth preferred embodiment) and the IDT, reflector, and wiring portion on the piezoelectric substrate causes the inflow of the sealing resin, a gap of a fixed spacing is required between the IDT, reflector, wiring portion, etc., on the piezoelectric substrate and the outer barrier in the fourth preferred embodiment in consideration of variations in manufacturing, such as mounting accuracy of the surface acoustic wave element to the mounting board, etc. In the fourth preferred embodiment, since the second outer barrier is disposed in an area between the IDT, reflector, wiring portion, etc., on the piezoelectric substrate and the outer barrier (first outer barrier in the present Embodiment 4), even if the second outer barrier is added, it is not required to increase the size of the piezoelectric substrate.

In the present preferred embodiment, it is possible to adopt the following modified example. That is, as shown in FIG. 20, the first outer barrier 42 provided on the functional surface of the surface acoustic wave element 2 may not have any level difference. Also in this case, since the second outer barrier 43 is provided inside the first outer barrier 42, even if the sealing resin 5 for sealing the outer peripheral edge of the surface acoustic wave element 2 flows in over the first barrier 42, the second outer barrier 43 can prevent low molecular components of the sealing resin 5 running over the first outer barrier 42 from flowing in to the vibrating portion 6.

However, as described above, when the first outer barrier 42 is formed to have the level difference, it goes without saying that the sealing resin 5 can be more assuredly prevented from flowing in. Furthermore, in the present preferred embodiment, in the same way as in the second preferred embodiment, the board-side barrier may be provided at a location opposite to the first outer barrier 42 on the mounting board 3. Moreover, it desirable that the total height of the first outer barrier 42 and the board-side barrier be lower than the total height of the bumps 4 after the surface acoustic wave element 2 and the mounting board 3 have been connected through the bumps 4 and the electrode lands formed on the mounting surface of the mounting board 3.

According to a surface acoustic wave device of various preferred embodiments of the present invention, the sealing resin for sealing a gap between a surface acoustic wave element and a mounting board can be surely prevented from flowing in to reach the vibrating portion of the surface acoustic wave element.

While the present invention has been described with respect to preferred embodiments, it will be apparent to those skilled in the art that the disclosed invention may be modified in numerous ways and may assume many embodiments other than those specifically set out and described above. Accordingly, it is intended by the appended claims to cover all modifications of the invention which fall within the true spirit and scope of the invention.

The invention claimed is:

1. A surface acoustic wave device comprising:
   a surface acoustic wave element having, on a functional surface thereof, a vibrating portion including at least one comb-shaped electrode portion disposed on a piezoelectric substrate;
   a mounting board; and
   a sealing resin; wherein
   the surface acoustic wave element and the mounting board are connected through bumps so that a mounting surface of the mounting board and the functional surface of the surface acoustic wave element face each other, an outer peripheral edge of the surface acoustic wave element is sealed by the sealing resin, and a vibration space is secured between the vibrating portion of the surface acoustic wave element and the mounting surface of the mounting board; and
   an outer barrier disposed so as to enclose the bumps and the vibrating portion is provided on the functional surface of the surface acoustic wave element so as to be disposed only between the functional surface of the surface acoustic wave element and the mounting board, and the outer barrier includes a level difference defined by a lower surface of the outer barrier having portions that are disposed at different distances from the mounting board.

2. A surface acoustic wave device as claimed in claim 1, wherein the level difference in the outer barrier is defined by at least one concave portion.

3. A surface acoustic wave device as claimed in claim 1, wherein the level difference in the outer barrier is defined by at least one convex portion.

4. A surface acoustic wave device as claimed in claim 1, wherein a board-side barrier is disposed on the mounting board so as to face the outer barrier.

5. A surface acoustic wave device as claimed in claim 4, wherein the total height of the outer barrier and the board-side barrier is lower than the total height of the bumps after the surface acoustic wave element and the mounting board have been connected through the bumps and the electrode lands disposed on the mounting surface of the mounting board.

6. A surface acoustic wave device comprising:
   a surface acoustic wave element having, on a functional surface thereof, a vibrating portion including at least one comb-shaped electrode portion disposed on a piezoelectric substrate;
   a mounting board; and
   a sealing resin; wherein
   the surface acoustic wave element and the mounting board are connected through bumps so that a mounting surface of the mounting board and the functional surface of the surface acoustic wave element face each other, an outer peripheral edge of the surface acoustic wave element is sealed by the sealing resin, and a vibration space is secured between the vibrating portion of the surface acoustic wave element and the mounting surface of the mounting board; and
   an outer barrier disposed so as to enclose the bumps and the vibrating portion and an inner barrier disposed inside the bumps so as to enclose the vibrating portion are included on the functional surface of the surface acoustic wave element.

7. A surface acoustic wave device as claimed in claim 6, wherein the outer barrier is higher than the inner barrier.

8. A surface acoustic wave device as claimed in claim 7, wherein the height of the outer barrier is lower than the total height of the bumps after the surface acoustic wave element and the mounting board have been connected through the bumps and the electrode lands disposed on the mounting surface of the mounting board, and the height of the inner barrier is lower than the height of the bumps after the surface acoustic wave element and the mounting board have been connected through the bumps.

9. A surface acoustic wave device as claimed in claim 6, wherein at least the inner barrier is made of a material that is inferior in wettability against the sealing resin to the functional surface of the surface acoustic wave element and the mounting surface of the mounting board.

10. A surface acoustic wave device as claimed in claim 6, wherein the inner barrier includes a first inner barrier and a second inner barrier.

11. A surface acoustic wave device as claimed in claim 10, wherein the first inner barrier and the second inner barrier have nearly the same height.

12. A surface acoustic wave device as claimed in claim 10, wherein the first inner barrier and the second inner barrier are made of the same material.

13. A surface acoustic wave device as claimed in claim 6, wherein the outer barrier has a level difference defined by a lower surface of the outer barrier having portions that are disposed at different distances from the mounting board.

14. A surface acoustic wave device comprising:
- a surface acoustic wave element having, on a functional surface thereof, a vibrating portion including at least one comb-shaped electrode portion disposed on a piezoelectric substrate;
- a mounting board; and
- a sealing resin; wherein
- the surface acoustic wave element and the mounting board are connected through bumps so that the mounting surface of the mounting board and the functional surface of the surface acoustic wave element face each other, an outer peripheral edge of the surface acoustic wave element is sealed by the sealing resin, and a vibration space is secured between the vibrating portion of the surface acoustic wave element and the mounting surface of the mounting board; and
- a first outer barrier disposed so as to enclose the bumps and the vibrating portion and a second outer barrier disposed inside the first outer barrier so as to enclose the bumps and the vibrating portion are provided on the functional surface of the surface acoustic wave element.

15. A surface acoustic wave device as claimed in claim 14, wherein the first outer barrier is higher than the second outer barrier.

16. A surface acoustic wave device as claimed in claim 15, wherein the height of the first outer barrier is lower than the total height of the bumps after the surface acoustic wave element and the mounting board have been connected through the bumps and the electrode lands disposed on the mounting surface of the mounting board, and the height of the second outer barrier is higher than the height of the bumps after the surface acoustic wave element and the mounting board have been connected through the bumps.

17. A surface acoustic wave device as claimed in claim 14, wherein the first outer barrier includes at least two layers, and the lowest layer of the first outer barrier has the same height as the second outer barrier.

18. A surface acoustic wave device as claimed in claim 14, wherein at least the second outer barrier is made of a material that is inferior in wettability against the sealing resin to the functional surface of the surface acoustic wave element and the mounting surface of the mounting board.

19. A surface acoustic wave device as claimed in claim 18, wherein the first outer barrier includes a level difference defined by a lower surface of the outer barrier having portions that are disposed at different distances from the mounting board.

20. A surface acoustic wave device as claimed in claim 19, wherein the level difference in the first outer barrier is defined by at least one concave portion.

21. A surface acoustic wave device as claimed in claim 19, wherein the level difference in the first outer barrier is defined by at least one convex portion.

* * * * *